US010426001B2

(12) United States Patent
Nasman et al.

(10) Patent No.: US 10,426,001 B2
(45) Date of Patent: Sep. 24, 2019

(54) PROCESSING SYSTEM FOR ELECTROMAGNETIC WAVE TREATMENT OF A SUBSTRATE AT MICROWAVE FREQUENCIES

(71) Applicant: Tokyo Electron Limited, Tokyo (JP)

(72) Inventors: Ronald Nasman, Averill Park, NY (US); Mirko Vukovic, Slingerlands, NY (US); Gerrit J. Leusink, Rexford, NY (US); Rodney L. Robison, East Berne, NY (US); Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 444 days.

(21) Appl. No.: 14/195,005

(22) Filed: Mar. 3, 2014

(65) Prior Publication Data

US 2014/0273532 A1    Sep. 18, 2014

Related U.S. Application Data

(60) Provisional application No. 61/801,069, filed on Mar. 15, 2013.

(51) Int. Cl.
*H05B 6/80* (2006.01)
*H01L 21/67* (2006.01)
(Continued)

(52) U.S. Cl.
CPC ........... *H05B 6/806* (2013.01); *H01L 21/268* (2013.01); *H01L 21/67109* (2013.01);
(Continued)

(58) Field of Classification Search
CPC ........ H05B 6/806; H05B 6/701; H05B 6/707; H05B 6/72
(Continued)

(56) References Cited

U.S. PATENT DOCUMENTS 4,825,221 A    4/1989  Suzuki et al.
4,958,590 A *  9/1990  Goforth .................. C23C 16/27
                                              118/723 MW
(Continued)

OTHER PUBLICATIONS

International Searching Authority, Search Report and Written Opinion of corresponding International Application No. PCT/US14/20510 dated Jul. 9, 2014, 14 pp.
(Continued)

*Primary Examiner* — Tu B Hoang
*Assistant Examiner* — Erin E McGrath
(74) *Attorney, Agent, or Firm* — Wood Herron & Evans LLP

(57) ABSTRACT

A processing system is disclosed, having a process chamber that houses a substrate for exposure of a surface of the substrate to a travelling electromagnetic (EM) wave. The processing system also includes an EM wave transmission antenna configured to launch the travelling EM wave into the process chamber for the travelling EM wave to propagate in a direction substantially parallel to the surface of the substrate. The processing system also includes a power coupling system configured to supply EM energy into the EM wave transmission antenna to generate the travelling EM wave at a prescribed output power and in a prescribed EM wave mode during treatment of the substrate. The processing system also includes an EM wave receiving antenna configured to absorb the travelling EM wave after propagation through the process chamber.

14 Claims, 10 Drawing Sheets

(51) Int. Cl.
*H05B 6/72* (2006.01)
*H05B 6/70* (2006.01)
*H01L 21/268* (2006.01)

(52) U.S. Cl.
CPC .. *H01L 21/67115* (2013.01); *H01L 21/67248* (2013.01); *H05B 6/701* (2013.01); *H05B 6/707* (2013.01); *H05B 6/72* (2013.01)

(58) Field of Classification Search
USPC ........................................................ 219/746
See application file for complete search history.

(56) References Cited

U.S. PATENT DOCUMENTS

| | | | |
|---|---|---|---|
| 5,188,862 A * | 2/1993 | Itatani | B23P 5/00 |
| | | | 117/103 |
| 5,291,146 A | 3/1994 | Friz | |
| 6,847,003 B2 * | 1/2005 | Ishii | H01J 37/32192 |
| | | | 118/723 I |
| 6,870,123 B2 | 3/2005 | Suzuki et al. | |
| 6,900,765 B2 | 5/2005 | Navarro et al. | |
| 7,138,767 B2 | 11/2006 | Chen et al. | |
| 7,582,569 B2 | 9/2009 | Ohmi et al. | |
| 7,760,046 B2 | 7/2010 | Tilford et al. | |
| 8,513,578 B2 | 8/2013 | Shimizu | |
| 8,570,212 B2 | 10/2013 | Yano | |
| 2001/0002670 A1 * | 6/2001 | Omori | H05B 6/72 |
| | | | 219/748 |
| 2005/0241768 A1 | 11/2005 | Kawamura et al. | |
| 2006/0049138 A1 | 3/2006 | Miyake et al. | |
| 2006/0065621 A1 | 3/2006 | Chen et al. | |
| 2012/0086107 A1 | 4/2012 | Yamamoto et al. | |
| 2012/0103975 A1 | 5/2012 | Okajima | |
| 2012/0218799 A1 * | 8/2012 | Furukawa | H02J 17/00 |
| | | | 363/126 |
| 2013/0206749 A1 * | 8/2013 | Libman | H05B 6/686 |
| | | | 219/553 |
| 2014/0015705 A1 | 1/2014 | Ebihara et al. | |
| 2014/0028190 A1 | 1/2014 | Voronin et al. | |

OTHER PUBLICATIONS

The International Bureau of WIPO, International Preliminary Report on Patentability issued in corresponding PCT Application No. PCT/US2014/020510 dated Sep. 15, 2015, 7 pp.

* cited by examiner

PROCESSING SYSTEM FOR ELECTROMAGNETIC WAVE TREATMENT OF A SUBSTRATE AT MICROWAVE FREQUENCIES

CROSS REFERENCE TO RELATED APPLICATION

Pursuant to 37 C.F.R. § 1.78(a)(4), this application claims the benefit of an priority to prior filed Provisional Application Ser. No. 61/801,069, filed Mar. 15, 2013, which is expressly incorporated herein by reference.

FIELD OF THE INVENTION

This invention relates to semiconductor processing technology, and more particularly, to apparatus and methods for controlling properties of a processing system for treating a substrate.

BACKGROUND OF THE INVENTION

Typically, it is desirable to activate dopants in semiconductors in a manner that does not allow the dopants to diffuse during activation. Typically, conventional high temperature anneals are used to activate the dopants with thermal stimulation while preventing the dopants from diffusing. Dopant activation typically requires minimal ion movement. As a result, dopants are activated in a relatively short time span when high temperature anneals are used.

High temperature annealing technologies have been created with faster dwell times to allow dopant activation with minimal thermal diffusion. Faster dwell times minimize the amount of time that the high temperatures must be sustained to activate the dopants. Examples of conventional high temperature anneals that implement fast dwell times are laser spike annealing, milli-second annealing, and rapid thermal annealing. Even though fast dwell times are used to prevent the dopants from diffusing, the high temperatures required by the conventional high temperature anneals still may exceed 1000 degrees Celsius and these high temperatures are often times not tolerable even for fast dwell times. To continue Moore's law scaling, devices and device structures are being introduced with reduced thermal tolerances, and thermal budgets are being reduced for semiconductor processing systems. For example, thermal tolerances for some semiconductor substrates during annealing have been reduced to below 400 degrees Celsius.

It is becoming common wisdom to use conventional electromagnetic (EM) wave treatments in thermal annealing and dopant activation processes. Conventional EM wave treatment heats the dopants locally, which then reduces the heat that the substrate as a whole receives. Conventional EM wave treatment does not require active heating as other conventional thermal annealing processes require. As a result, the heating that the substrate is exposed to comes from residual heating which requires reduced temperatures below 500 degrees Celsius. However, conventional EM wave treatment with reduced temperatures below 500 degrees Celsius still precludes applications that require temperatures to be reduced even further.

Conventional EM wave treatment typically implements surface waves that resonate across the surfaces of the semiconductors at EM wave frequencies where the surface waves are conventional standing waves. A conventional standing wave is a wave where each non-node remains in the same location on the semiconductor surface. Conventional EM wave treatments implementing conventional standing waves are inefficient, non-uniform, and difficult to control, which has the effect of increasing the temperatures of the conventional EM wave treatments rather than lowering the temperatures. Therefore, an effective means to implement EM wave treatments of semiconductor surfaces with lower processing temperatures is needed.

SUMMARY OF THE INVENTION

The present invention provides a processing system for electromagnetic (EM) wave treatment of a substrate, including a process chamber configured to house a substrate for exposure of a surface of the substrate to a travelling EM wave. The processing system also includes an EM wave transmission antenna configured to launch the travelling EM wave into the process chamber for the travelling EM wave to propagate in a direction substantially parallel to the surface of the substrate. The EM wave transmission antenna includes an output end coupled to an input port of the process chamber. The processing system also includes a power coupling system configured to supply EM energy into the EM wave transmission antenna to generate the travelling EM wave at a prescribed output power and in a prescribed EM wave mode during treatment of the substrate. The power coupling system is coupled to an input end of the EM wave transmission antenna. The processing system also includes an EM wave receiving antenna configured to absorb the travelling EM wave after propagation through the process chamber. The EM wave receiving antenna includes an input end coupled to an output port of the process chamber.

A method for treating a substrate with electromagnetic (EM) energy is also provided. The method starts with disposing a substrate on a substrate holder in a process chamber. The method further includes launching a travelling EM wave into the process chamber to propagate in a direction substantially parallel to a surface of the substrate. The method further includes exposing the surface of the substrate to the travelling EM wave as the travelling EM wave propagates through the process chamber in the direction substantially parallel to the surface of the substrate. The method further includes absorbing the travelling EM wave after the travelling EM wave propagates through the process chamber.

The present invention also provides for electromagnetic (EM) wave treatment of a substrate, including a process chamber configured to house the substrate for exposure of a surface of the substrate to a surface EM wave. The processing system also includes a substrate holder enclosed by the process chamber that is configured to cool the substrate as the surface of the substrate is exposed to the surface EM wave. The processing system also includes an EM wave transmission antenna configured to launch the surface EM wave into the process chamber for the surface EM wave to propagate in a direction substantially parallel to the surface of the substrate. The EM wave transmission antenna includes an output end coupled to an input port of the process chamber. The processing system also includes a power coupling system configured to supply EM energy into the EM wave transmission antenna to generate the surface EM wave at a prescribed output power and in a prescribed EM wave mode during the cooling of the substrate. The power coupling system is coupled to an input end of the EM wave transmission antenna. The processing system also includes an EM wave receiving antenna configured to absorb the surface of the EM wave after propagation through the process chamber. The EM wave receiving antenna includes an input end coupled to an output port of the process chamber.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

Figure 1:
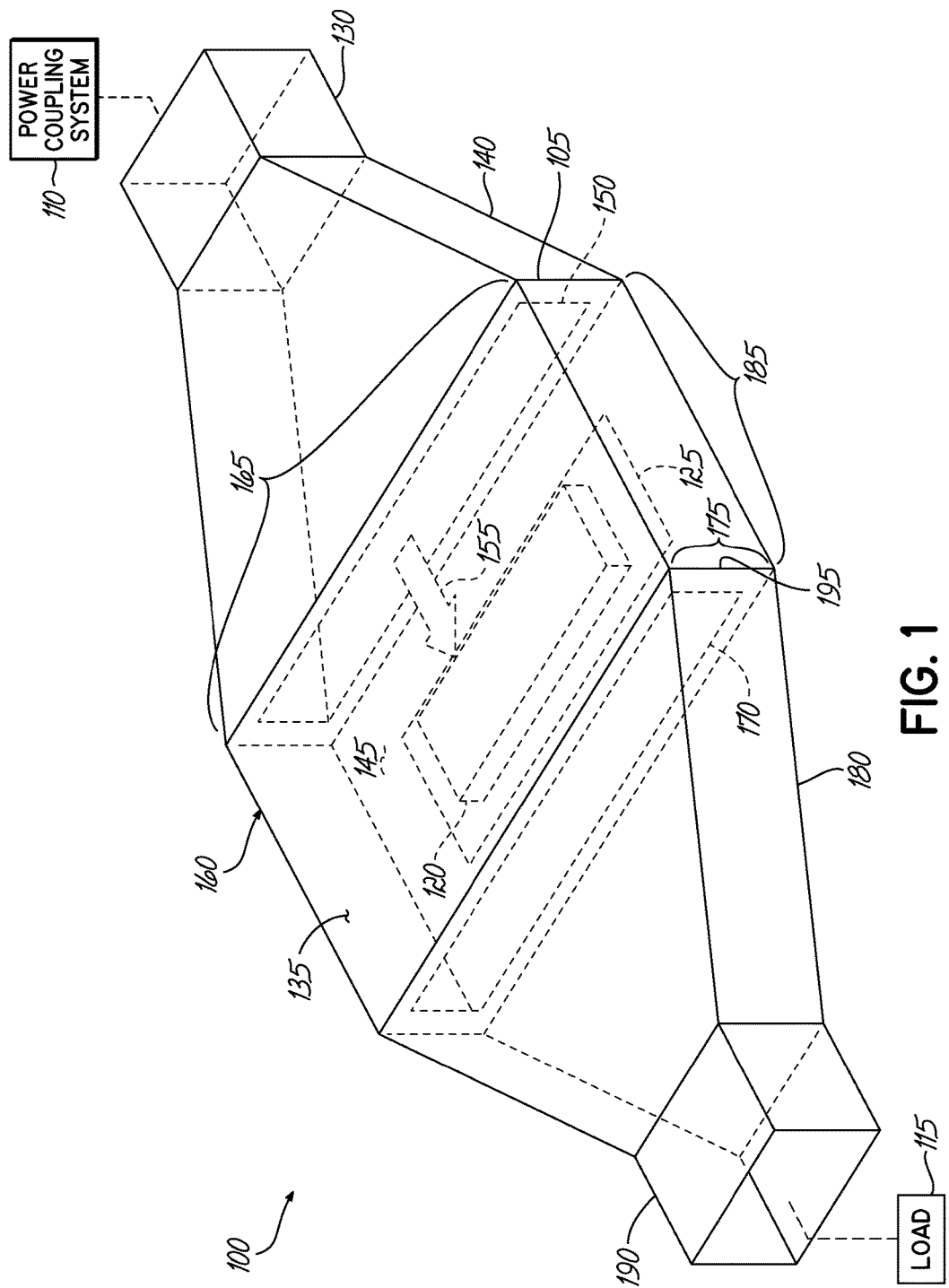
FIG. 1 illustrates an exemplary processing system for EM wave treatment of a substrate in accordance with an embodiment of the invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to exemplary embodiments within the scope of the present invention. Therefore, the Detailed Description is not meant to limit the present invention. Rather, the scope of the present invention is defined only in accordance with the following claims and their equivalents.

The following Detailed Description of the exemplary embodiments will so fully reveal the general nature of the present invention that others can, by applying knowledge of those skilled in the relevant art(s), readily modify and/or adapt for various applications such exemplary embodiments, without undue experimentation, without departing from the scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

For more efficient electromagnetic (EM) wave treatment of a substrate in a process chamber, the present invention generates EM wave emissions that radiate into the process chamber with travelling EM waves that propagate in a direction substantially parallel to a surface of a substrate housed in the process chamber. The relevant surface of the substrate is the surface to be activated, i.e., the doped surface. The surface is an exposed surface and is opposite the surface that resides on a substrate holder, i.e., the mounted surface. For ease of discussion, this relevant surface to be activated by the EM wave treatment will simply be referred to as the surface of the substrate or substrate surface.

One of ordinary skill in the art will recognize that travelling EM waves are EM waves where each non-node moves across the surface of the substrate as the travelling EM wave propagates through the process chamber rather than where each non-node remains in the same location of the exposed surface of the substrate as in conventional standing waves. Consequently, travelling EM waves can be controlled to create a relatively even distribution of exposure of the exposed surface of the substrate to the travelling EM waves.

For example, the likelihood that the surface of the substrate is exposed to an even distribution of the travelling EM waves increases as compared to conventional standing waves. The travelling EM waves propagate across the surface of the substrate increasing the overall surface area of the surface of the substrate that is exposed to the non-nodes of the travelling EM waves. As the surface area of the substrate that is exposed to the non-nodes of the travelling EM waves increases, the overall uniformity of the dopant activation for the substrate also increases. The increased overall uniformity of the dopant activation increases the overall effectiveness of the dopant activation for the substrate. Conventional standing waves ensure that only specific locations of the substrate are exposed to the non-nodes of the conventional standing waves while other locations of the substrate surface are not exposed to the non-nodes of the conventional standing waves. Thus, the dopant activation of the substrate surface that is exposed to the conventional standing waves is less uniform and less effective as compared to the substrate that is exposed to the travelling EM waves.

As the following description will show in detail, the disclosed invention takes advantage of this property to increase the overall exposure of the substrate surface to the travelling EM waves as the travelling EM waves propagate across the surface of the substrate. This serves to improve the uniformity of the dopant activation of the substrate surface with minimal thermal diffusion while lowering the temperatures that the substrate and/or the process chamber are exposed to. In the description that follows, even though references may be made to microwave or other enumerated bands of electromagnetic emissions, it should be understood that the system and method apply to a wide variety of desired electromagnetic wave modes (waves of a chosen frequency, amplitude, and phase).

FIG. 1 depicts a processing system 100 for EM wave treatment of a substrate. A power coupling system 110 provides input EM energy into an EM wave transmission antenna 130. The EM wave transmission antenna 130 may include but is not limited to a dipole antenna, a yagi antenna, a whip antenna, a phased array antenna, a loop antenna, a slot antenna, a radial line slot antenna ("RLSA") and/or any other type of antenna designed to radiate travelling EM wave 155 that will be apparent to those skilled in the relevant art(s) without departing from the scope of the present invention. The EM wave transmission antenna 130 includes a waveguide 140, which is depicted as a rectangular wave guide 140. Although the waveguide 140 is depicted as a rectangular waveguide 140 in FIG. 1, the waveguide 140 may also include but is not limited to a spherical waveguide, a coaxial waveguide, a fiber optical waveguide, and/or any other type of waveguide designed to guide travelling EM wave 155 that will be apparent to those skilled in the relevant art(s) without departing from the scope of the present invention.

In the description that follows, the EM wave transmission antenna 130 that includes the waveguide 140 may be collectively referred to as an EM wave launcher. When energized, the power coupling system 110 generates EM energy into the EM wave transmission antenna 130 that radiates the EM energy as the travelling EM wave 155 is propagated through the waveguide 140. The output end of the waveguide 140 is coupled to an input port 150 of the process chamber 160. The process chamber 160 includes a planar bottom surface 145 and a planar top surface 135 where the planar top surface 135 opposes the planar bottom surface 145. The sidewall 105 of the process chamber 160 extends between the planar bottom surface 145 of the process chamber 160 and the planar top surface 135 of the process chamber 160.

In an embodiment where a vacuum seal of the process chamber 160 is desired, the input port 150 may be mated with the sidewall 105 of the process chamber 160 to provide a hermetic seal for the process chamber 160 and the waveguide 140, and also act as a portal for transmission of the travelling EM wave 155 into the process chamber 160. In such a hermetically sealed embodiment, the input port 150 may include but is not limited to a metal seal, a welded seal, a dielectric window and/or any other type of hermetic seal that adequately seals the process chamber 160 while maintaining any reflection generated by the travelling EM wave 155 below a specified threshold that will be apparent to those skilled in the relevant art(s) without departing from the scope of the present invention.

The process chamber 160 houses a substrate 120 so the substrate 120 can be exposed to the travelling EM wave 155. The process chamber 160 may house the substrate 120 in a vacuum. The process chamber 160 may also expose the substrate to atmospheric conditions. The substrate 120 is placed on top of a substrate holder 125. In an embodiment, the substrate 120 and the substrate holder 125 are located substantially coplanar with the planar bottom surface 145 of the process chamber 160 with a gap between the planar bottom surface 145 and the substrate 120. In another embodiment, the substrate 120 and the substrate holder 125 are located on the planar bottom surface 145 of the process chamber 160 without a gap between the substrate 120 and the planar bottom surface 145. In another embodiment, as will be discussed in further detail below, the process chamber 160 houses the substrate 120 so that the substrate 120 may undergo adequate dopant activation for the substrate 120 with minimal thermal diffusion while being exposed to lower temperatures during the dopant activation. The travelling EM wave 155 propagates through the process chamber 160 from the EM wave launcher in a direction substantially parallel to the surface of the substrate 120. As the travelling EM wave 155 propagates through the process chamber, the non-nodes of the travelling EM wave 155 activate the dopants of the substrate 120 with minimal thermal diffusion.

In an embodiment, process chamber 160 is depicted with a rectangular geometry. The geometry of process chamber 160 includes a width 165, a shallow height 175 and/or a depth 185 that is designed to adequately fit the substrate 120. The geometry maximizes the exposure of the substrate 120 to the travelling EM wave 155, and provides control of the travelling EM wave 155 as the travelling EM wave 155 propagates through the process chamber 160.

The process chamber 160 is designed to minimize reflections of the travelling EM wave 155 as the travelling EM wave 155 propagates through the process chamber 160. The reflections that result from the travelling EM wave 155 propagating within the process chamber 160 generates standing waves which decreases the effectiveness of the dopant activation of the substrate 120. For example, the top planar surface 135 of the process chamber 160 may be a surface with a dome and/or concave design. The dome and/or concave surface of the top planar surface 135 also minimizes the reflections of the travelling EM wave 155 as the travelling EM wave 155 propagates through the process chamber 160. Thus, the process chamber 160 is designed to minimize reflections of the travelling wave 155 to increase the effectiveness of the dopant activation of the substrate 120.

Although the process chamber 160 is depicted as a rectangular chamber in FIG. 1, the process chamber 160 may also include but is not limited to a circular chamber, a square chamber, a triangular chamber and/or any other geometry of process chamber 160 to house the substrate 120 as the substrate 120 is processed that will be apparent to those skilled in the relevant art(s) without departing from the scope of the present invention.

As the travelling EM wave 155 propagates through the process chamber 160, an EM wave receiving antenna 190 receives the travelling EM wave 155 and removes the travelling EM wave 155 from the process chamber 160. The EM wave receiving antenna 190 is designed as a counterpart of the EM wave transmission antenna 130 so that the EM wave receiving antenna 190 receives the travelling EM wave 155 transmitted by the EM wave transmission antenna 130. The EM wave receiving antenna 190 may include but is not limited to a dipole antenna, a yagi antenna, a whip antenna, a phased array antenna, a loop antenna, a slot antenna, a RLSA and/or any other type of antenna that receives the travelling EM wave 155 transmitted by the EM wave transmission antenna 130 that will be apparent to those skilled in the relevant art(s) without departing from the scope of the present invention.

The EM wave receiving antenna 190 includes a waveguide 180 which is depicted as a rectangular waveguide 180. An input end of the waveguide 180 is coupled to the output port 170 of the process chamber 160. The waveguide 180 receives the travelling EM wave 155 as the travelling EM wave 155 propagates through the process chamber 160. Although the waveguide 180 is depicted as a rectangular waveguide 180 in FIG. 1, the waveguide 180 may also include but is not limited to a spherical waveguide, a coaxial waveguide, a fiber optic waveguide, and/or any other type of waveguide designed to guide the travelling EM wave 155 that will be apparent to those skilled in the relevant art(s) without departing from the scope of the present invention.

In the description that follows, the EM wave receiving antenna 190 that includes the waveguide 180 and a load 115 may be collectively referred to as an EM absorbing load. In an embodiment, the EM absorbing load absorbs the travelling EM wave 155 after the travelling EM wave 155 propagates through the process chamber 160. As noted above regarding the input port 150, the output port 170 may be mated with the sidewall 195 of the process chamber 160 to provide a hermetic seal for the process chamber 160, the waveguide 180 and a portal for transmission of travelling EM wave 155 out of the process chamber 160 and into the EM absorbing load when a vacuum seal of the process chamber 160 is desired.

After the travelling EM wave 155 has propagated to receiving antenna 190, the load 115 may be coupled to the receiving antenna 190 to absorb the travelling EM wave 155 in a manner that minimizes any reflections generated by the receiving of the travelling EM wave 155 into the receiving antenna 190. As a result, the load 115 may be a fully absorbing load that so that the load 115 substantially absorbs all of the travelling EM wave 155 so that the reflections of the travelling EM wave 155 are minimized. For example, the load 115 may include a water-cooled resistor where a resistor is encompassed by water. The resistor may absorb the travelling EM wave 155 and then the water encompassing the resistor ensures that any reflection of the travelling EM wave 155 absorbed by the resistor is minimized. The load 115 may be any type of configuration that fully absorbs the travelling EM wave 155 to minimize reflections of the travelling EM wave 155 that will be apparent to those skilled in the relevant art(s) without departing from the scope of the present invention.

Figure 2:
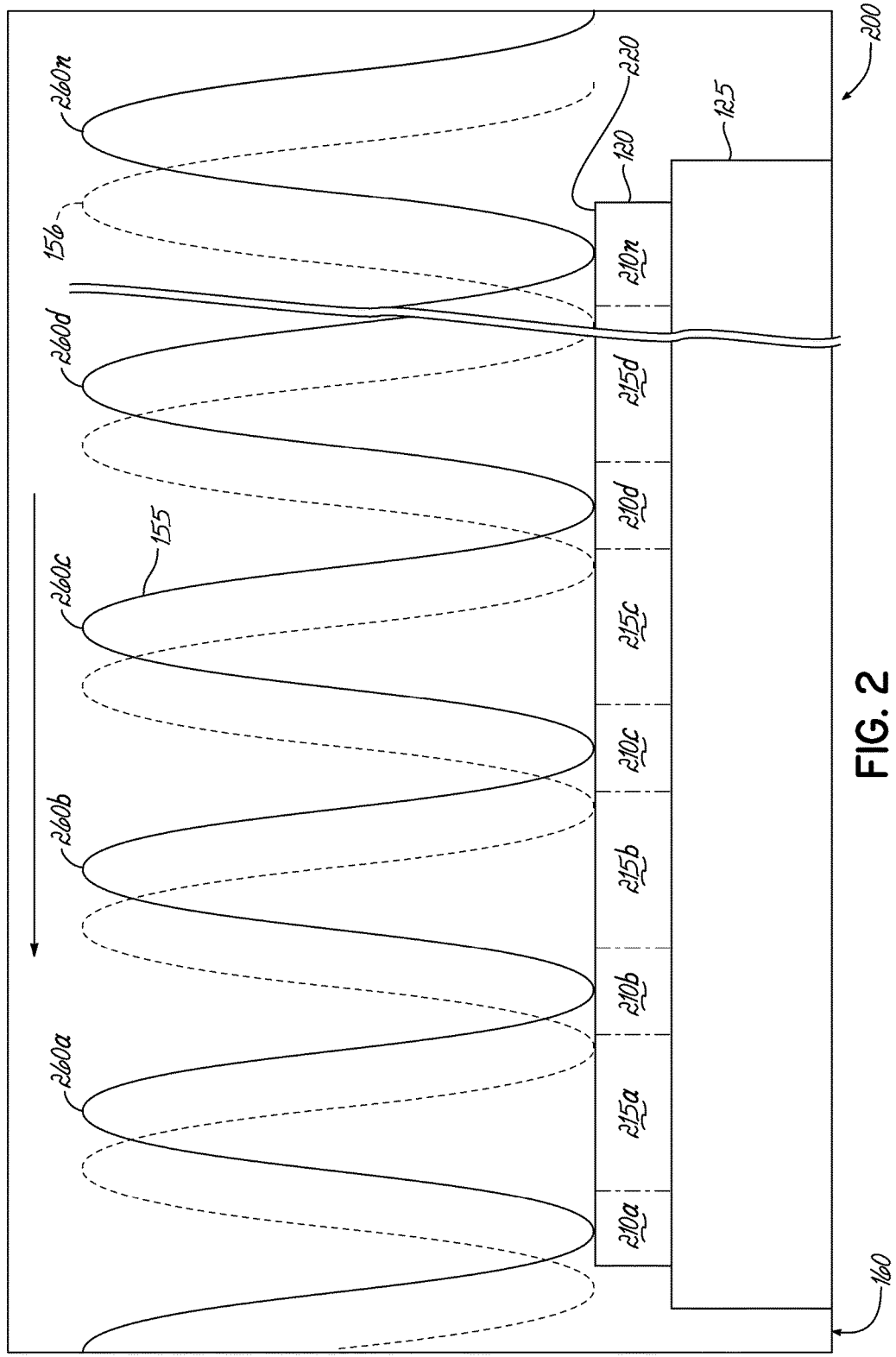
FIG. 2 illustrates a side view of an exemplary process chamber in accordance with an embodiment of the invention.

Referring to FIG. 2, in which like reference numerals are used to refer to like parts, a side view 200 of the process chamber 160 is shown. The process chamber 160 houses the substrate 120 that is placed on the substrate holder 125. The substrate 120 includes a plurality of node sections 210a through 210n where n is an integer equal to or greater than one and a plurality of non-node sections 215a through 215n where n is an integer equal to or greater than one. The travelling EM wave 155 propagates through the process chamber 160 in a direction substantially parallel to a surface 220 of the substrate 120. The travelling EM wave 155 propagates from the EM wave launcher (not shown) through the process chamber 160 and is removed from the process chamber 160 by the EM absorbing load (not shown). The travelling EM wave 155 includes a plurality of non-nodes 260a through 260n where n is an integer equal to or greater than one.

The travelling EM wave 155 resonates in a microwave frequency range of 1 GHz to 100 GHz. The travelling EM wave 155 resonating in the microwave frequency range adequately activates the dopants of the substrate 120 with minimal thermal diffusion while lowering the temperatures that the substrate 120 and/or the process chamber 160 are exposed to. Although the travelling EM wave 155 resonates in the microwave frequency range, the travelling EM wave 155 may also resonate in EM frequency ranges that include but are not limited to radio, infrared, visible light, ultraviolet, X-ray, gamma ray, and/or any other EM frequency range that will be apparent to those skilled in the relevant art(s) without departing from the scope of the present invention.

As noted above, each non-node 260a through 260n moves across the surface 220 of the substrate 120 as the travelling EM wave 155 propagates through the process chamber 160 rather than where each non-node 260a through 260n remains in the same location of the surface 220 of the substrate 120 as in conventional standing waves. Each non-node 260a through 260n includes high electric field strengths that increase the effectiveness of the dopant activation of the substrate 120. In contrast, each node of the travelling EM wave 155 includes low electric field strengths which have less effectiveness in dopant activation of the substrate as compared to the high electric field strengths of each non-node 260a through 260n. Thus, the movement of each non-node 260a through 260n of the travelling EM wave 155 increases the overall exposure of the surface 220 of the substrate 120 to each non-node 260a through 260n. This serves to improve the uniformity of the dopant activation of the substrate 120 as compared to conventional standing waves while lowering the temperatures that the substrate 120 is exposed to.

For example, as shown in FIG. 2, a snapshot of the travelling EM wave 155 is shown as the travelling EM wave 155 propagates through the process chamber 160. At an instant in time when the snapshot of the travelling EM wave 155 was taken, each non-node section 215a through 215n of the substrate 120 is exposed to each respective non-node 260a through 260n of the travelling EM wave 155. At the instant in time when the snapshot of the travelling EM wave 155 was taken, each node section 210a through 210n of the substrate 120 is not exposed to the plurality of non-nodes 260a through 260n. However, as the travelling EM wave 155 propagates through the process chamber 160 in real-time, each non-node 260a through 260n of the travelling EM wave 155 propagates across the surface 220 of the substrate 120. Thus, it is likely that each of the node sections 210a through 210n is also exposed to the plurality of non-nodes 260a through 260n as the travelling EM wave 155 propagates through the process chamber 160.

A conventional standing wave does not propagate across the substrate 120 so that the conventional standing wave limits exposure to the non-nodes of the conventional standing wave to the plurality of non-node sections 215a through 215n. The likelihood that each of the node sections 210a through 210n of the substrate 120 is exposed to the non-nodes of the conventional standing wave is substantially diminished because the non-nodes of the conventional standing wave fail to propagate across the surface 220 of the substrate 120. Thus, the travelling EM wave 155 increases the uniformity of dopant activation for the substrate 120 with minimal thermal diffusion while lowering the temperatures that the substrate 120 and/or the process chamber 160 are exposed to.

In an embodiment, both the travelling EM wave 155 and a second travelling EM wave 156 (shown in phantom) propagate through the process chamber 160. The travelling EM wave 155 and the second travelling EM wave 156 are out of phase with respect to each other. As a result, the sections of the substrate 120 that are exposed to the non-nodes of the travelling EM wave 155 differ from the sections of the substrate 120 that are exposed to the non-nodes of the second travelling EM wave 156. Thus, the likelihood that each section of the substrate is exposed to the non-nodes of a travelling EM wave is increased.

For example, the travelling EM wave 155 and the second travelling EM wave 156 propagate through the process chamber 160 out of phase with respect to each other. Each of the non-node sections 215a through 215n of the substrate 120 is exposed to each respective non-node 260a through 260n of the travelling EM wave 155. Each node section 210a through 210n of the substrate is exposed to each respective non-node of the second travelling EM wave 156 because the second travelling EM wave 156 and the travelling EM wave 155 are out of phase with respect to each. Thus, the travelling EM wave 155 and the second travelling EM wave 156 that propagate out of phase from each other increases the dopant activation of the substrate with minimal thermal diffusion while lowering the temperatures that the substrate 120 and/or the process chamber 160 are exposed to. The travelling EM wave 155 and the second travelling EM wave 156 may be out phase with respect to each other by a magnitude of 90 degrees and/or any other magnitude that will be apparent to those skilled in the relevant art(s) without departing from the scope of the present invention.

Figure 3:
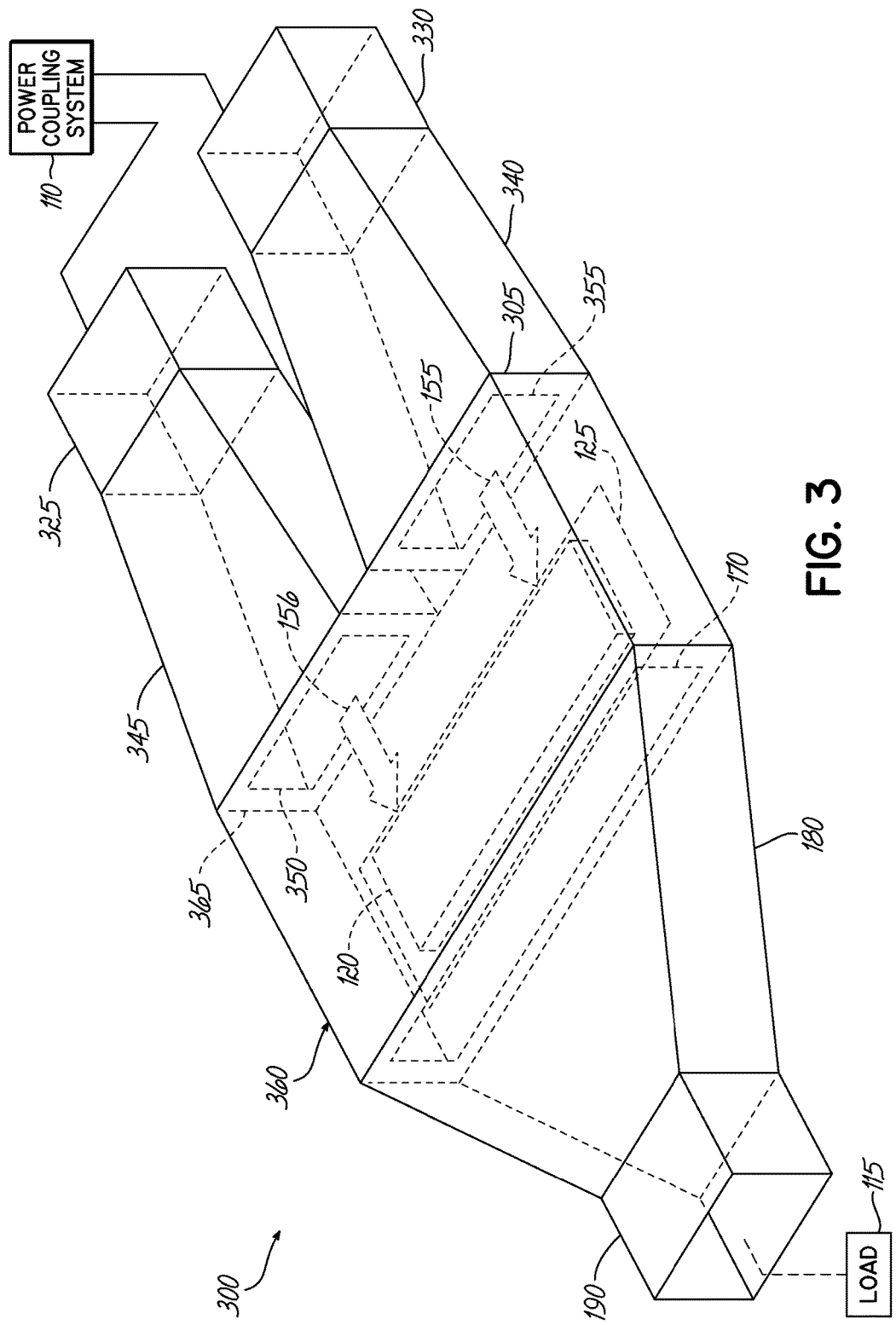
FIG. 3 illustrates an exemplary processing system for EM wave treatment of a substrate in accordance with an embodiment of the invention.

Referring to FIG. 3, in which like reference numerals are used to refer to like parts, a processing system 300 for EM wave treatment of a substrate is shown. The processing system 300 shares many similar features with the processing system 100; therefore, only the differences between the processing system 300 and the processing system 100 are to be discussed in further detail. Rather than having the single travelling EM wave 155 that propagates across the substrate 120, the system is modified to generate several travelling EM waves to maximize the exposure of the substrate 120. For example, as shown in FIG. 3, the substrate 120 is exposed to the first travelling EM wave 155 and the second travelling EM wave 156.

The power coupling system 110 provides input EM energy into a first EM wave transmission antenna 325 and a second EM wave transmission antenna 330. The first EM wave transmission antenna 325 and the second EM wave transmission antenna 330 may each be as described above for the EM wave transmission antenna 130, and include a first waveguide 345 and a second waveguide 340, respectively, which are depicted as rectangular waveguides 345, 340. As with the waveguide 140, although the first and second waveguides 345, 340 are depicted as rectangular in FIG. 3, the waveguides 340, 345 may also be spherical waveguides, coaxial waveguides, fiber optical waveguides, and/or any other type of waveguides designed to guide the first and second travelling EM waves 155, 156 that will be apparent to those skilled in the relevant art(s) without departing from the scope of the present invention.

In an embodiment, the first EM wave transmission antenna 325 is substantially similar to the second EM wave transmission antenna 330, with the first waveguide 345 and the second waveguide 340 also being substantially similar, and as a result, the first travelling EM wave 155 and the second travelling EM wave 156 are also substantially similar. The first travelling EM wave 155 and the second travelling EM wave 156 operate in substantially similar wave modes such as but not limited to having substantially similar frequencies, amplitudes, and/or phase. In another embodiment, the first travelling EM wave 155 and the second travelling EM wave 156 operate in substantially similar wave modes but differ in phase.

In another embodiment, the first EM wave transmission antenna 325 is different from the second EM wave transmission antenna 330, with the first waveguide 345 and the second waveguide 340 also being different, and as a result, the first travelling EM wave 155 and the second travelling EM wave 156 are also different. The first travelling EM wave 155 and the second travelling EM wave 156 operate in different wave modes such as but not limited to having different frequencies, amplitudes, and/or phase.

In the description that follows, the first EM wave transmission antenna 325 that includes the first waveguide 345 may be collectively referred to as a first EM wave launcher. When energized, the power coupling system 110 generates EM energy into the first EM wave transmission antenna 325 that radiates the EM energy as the first travelling EM wave 155 that is propagated through the first waveguide 345. The output end of the first waveguide 345 is coupled to a first input port 350 of a process chamber 360. The first input port 350 may be mated with the sidewall 365 of the process chamber 360 to provide a hermetic seal for the process chamber 360 and the first waveguide 345 and acts as a portal for transmission of the first travelling EM wave 155 into the process chamber 360 when a vacuum seal of the process chamber 360 is desired.

In the description that follows, the second EM wave transmission antenna 330 that includes the second waveguide 340 may be collectively referred to as a second EM wave launcher. When energized, the power coupling system 110 generates EM energy into the second EM wave transmission antenna 330 that radiates the EM energy as the second travelling EM wave 156 that is propagated through the second waveguide 340. The output end of the second waveguide 340 is coupled to a second input port 355 of the process chamber 360. The second input port 355 may be mated with the sidewall 305 of the process chamber 360 to provide a hermetic seal for the process chamber 360 and the second waveguide 340 and also acts as a portal for transmission of the second travelling EM wave 156 into the process chamber 360 when a vacuum seal of the process chamber 360 is desired.

As noted above, the first EM wave launcher generates the first travelling EM wave 155 and the second EM wave launcher generates the second travelling EM wave 156. The surface of the substrate 120 is exposed to both the first travelling EM wave 155 and the second travelling EM wave 156. The exposure of the substrate to both the first travelling EM wave 155 and the second travelling EM wave 156 increases the likelihood that each portion of the surface of the substrate 120 is exposed to a travelling EM wave.

For example, the first EM wave launcher and the second EM wave launcher are substantially similar so that the first travelling EM wave 155 and the second travelling EM wave 156 are also substantially similar. The exposure of the substrate 120 to both the first travelling EM wave 155 and the second travelling EM wave 156 that are substantially similar increases the likelihood that each portion of the surface of the substrate 120 is exposed to a travelling EM wave.

The generation of multiple travelling EM waves also increases the control of the exposure of the surface of the substrate 120 to a travelling EM wave. The EM wave launchers are designed to generate the travelling EM waves with EM wave mode characteristics tailored to the properties of the substrate 120.

For example, the first EM wave launcher and the second EM wave launcher may be configured differently so that the first travelling EM wave 155 and the second travelling EM wave 156 are also different. As a result, a first portion of the surface of the substrate 120 is exposed to the first travelling EM wave 155 while a second portion of the surface of the substrate 120 is exposed to the second travelling EM wave 156. The first portion includes properties different from the second portion. As a result, the first portion is exposed to the first travelling EM wave 155 that has EM wave mode characteristics tailored to the properties included in the first portion while the second portion is exposed to the second travelling EM wave 156 that has EM wave mode characteristics tailored to the properties included in the second portion.

In an embodiment, the power coupling system 110 switches the EM energy that is generated by the power coupling system 110 back and forth between the first EM wave launcher and the second EM wave launcher. The switching of the EM energy that is generated by the power coupling system 110 back and forth between the first EM wave launcher and the second EM wave launcher generates overlapping exposure patterns of the first travelling EM wave 155 and the second travelling EM wave 156 onto the substrate 120. Thus, the overall exposure of the surface of the substrate 120 to the first travelling EM wave 155 and the second travelling EM wave 156 is increased, which increases the effectiveness of the overall dopant activation of the substrate 120.

For example, the power coupling system 110 initially generates the EM energy into the first EM wave launcher to generate the first travelling EM wave 155. The surface of the substrate 120 is exposed to the first travelling EM wave 155 as the first travelling EM wave 155 propagates across the surface of the substrate 120. The power coupling system 110 then switches the EM energy to the second EM wave launcher to generate the second travelling EM wave 156. The surface of the substrate 120 is then exposed to an overlapping pattern of the first travelling EM wave 155 as the first travelling EM wave 155 propagates across the surface of the substrate 120 and the second travelling EM wave 156 as the second travelling EM wave 156 propagates across the surface of the substrate 120.

In an embodiment (not shown), the process chamber 360 houses two individual substrates rather than a single substrate 120. The first substrate is positioned in front of the first input port 350 so that the first substrate is exposed to the first travelling EM wave 155 generated by the first EM wave launcher. The second substrate is positioned in front of the second input port 355 so that the second substrate is exposed to the second travelling EM wave 156 generated by the second EM wave launcher. The first substrate is exposed to the first travelling EM wave 155 that has EM wave mode characteristics tailored to the properties included in the first substrate. The second substrate is exposed to the second travelling EM wave 156 that has EM wave mode characteristics tailored to the properties included in the second substrate.

A quantity of wave launchers may be equivalent to any integer equal to or greater than one required to adequately expose the substrate 120 to a quantity of travelling EM waves that may be equivalent to any integer equal to or greater than one that will be apparent to those skilled in the relevant art(s) without departing from the scope of the present invention. A quantity of substrates included in the process chamber 360 may also be equivalent to any integer equal to or greater than one that will be apparent to those skilled in the relevant art(s) without departing from the scope of the present invention.

Figure 4:
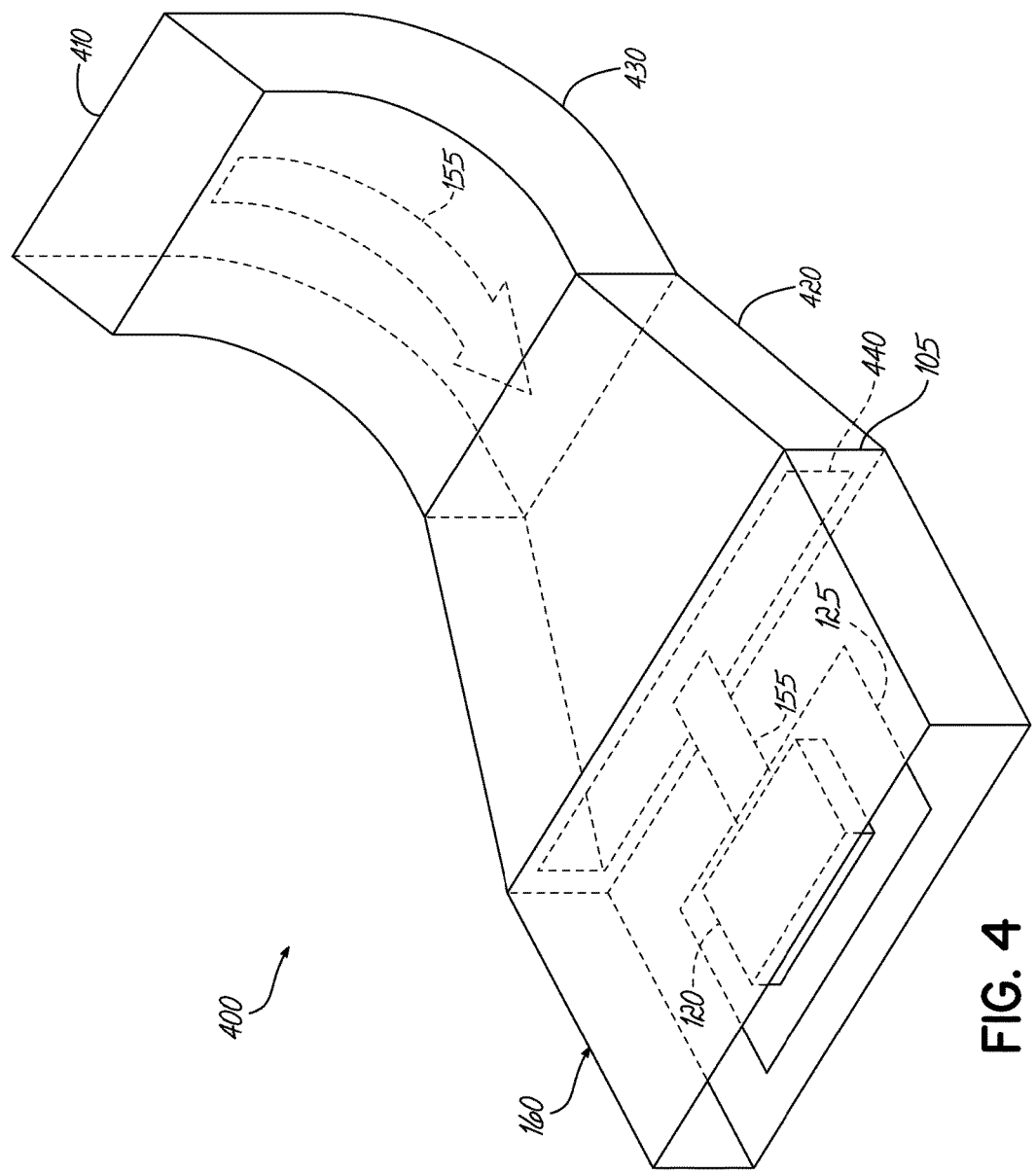
FIG. 4 illustrates an exemplary waveguide configuration for radiating an exemplary travelling EM wave into an exemplary process chamber in accordance with an embodiment of the invention.

Referring now to FIG. 4, in which like reference numerals are used to refer to like parts, a waveguide configuration 400 for radiating the travelling EM wave 155 into the process chamber 160 is shown. The waveguide configuration 400 shares many similar features with the waveguide 140; therefore, only the differences between the waveguide configuration 400 and the waveguide 140 are to be discussed in further detail. The waveguide configuration 400 includes a first waveguide section 410 and a second waveguide section 420. The output end of the second wave guide section 420 is coupled to an input port 440 of the process chamber 160. The input port 440 may be mated with sidewall 105 of the process chamber 160 to provide a hermetic seal for the process chamber 160 and the waveguide configuration 400 and also acts as a portal for transmission of the travelling EM wave 155 into the process chamber 160 when a vacuum seal of the process chamber 160 is desired.

The first waveguide section 410 receives the travelling EM wave 155 from an EM wave transmission antenna (not shown). The first waveguide section 410 is oriented substantially orthogonal to the second waveguide section 420. The first waveguide section 410 includes a bend 430 so that the travelling wave 155 progressively bends substantially 90 degrees in a curved transition as the travelling wave 155 propagates through the first waveguide section 410. The progressive bend of travelling wave 155 in a curved transition initiated by the bend 430 minimizes the reflection of the travelling wave 155 as the travelling wave propagates through the first wave guide section 410. Thus, the first waveguide section 410 then radiates the travelling EM wave 155 after the travelling EM wave 155 has progressively bent substantially 90 degrees in a curved transition into the second waveguide section in a direction that is now substantially orthogonal to the first waveguide section 410. The output of the first waveguide section 410 is coupled to the input of the second waveguide section 420. As the travelling EM wave 155 propagates through the output of the first waveguide section 410 and into the input of the second waveguide section 420, the travelling EM wave 155 is now substantially parallel to the substrate 120 as the EM wave 155 propagates through the output of the second waveguide section 420 into the process chamber 160.

Figure 5:
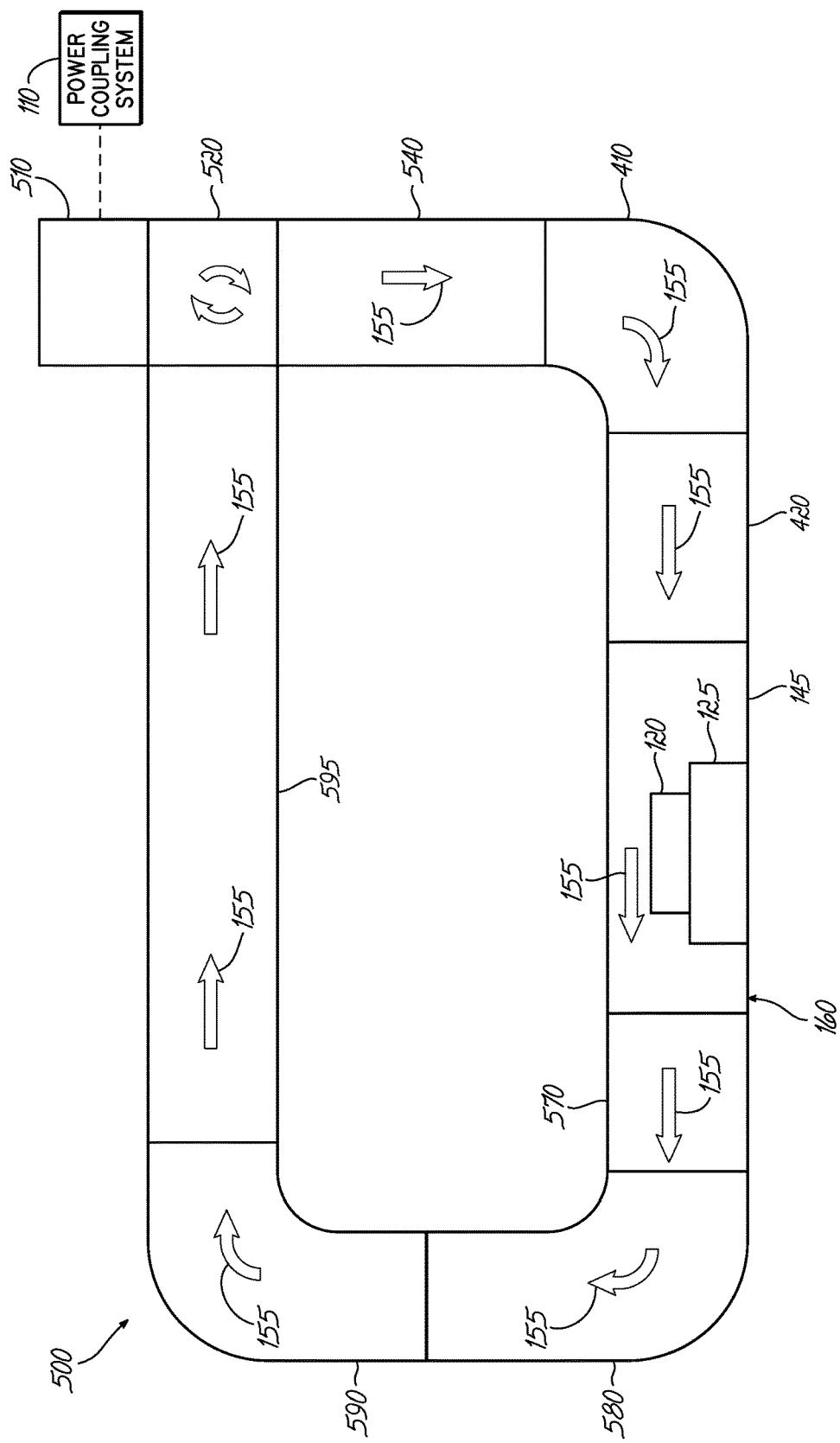
FIG. 5 illustrates a side view of an exemplary processing system for EM wave treatment of a substrate in accordance with an embodiment of the invention.

Referring now to FIG. 5, in which like reference numerals are used to refer to like parts, a side view of processing system 500 is shown to illustrate one possible configuration of a processing system for EM wave treatment of a substrate. The processing system 500 shares many similar features with the processing system 100 and the processing system 300 as well as the waveguide configuration 400; therefore, only the differences between the processing system 500 and the processing systems 100 and 300 and waveguide configuration 400 are to be discussed in further detail.

When energized, the power coupling system 110 generates EM energy into an EM wave transmission antenna 510 that radiates the EM energy as the travelling EM wave 155 is propagated into a circulator 520 that circulates the travelling EM wave 155 into a first transmission waveguide section 540. The travelling EM wave 155 then propagates into the first transmission waveguide section 410. The first transmission waveguide section 410 is substantially orthogonal to the second transmission waveguide section 420, as discussed in reference to FIG. 4. The travelling EM wave 155 thus progressively bends substantially 90 degrees in a curved transition as the travelling EM wave 155 propagates through the output end of the first transmission waveguide section 410 into the input end of the second transmission waveguide section 420.

After the travelling EM wave 155 progressively bends substantially 90 degrees in a curved transition, the travelling EM wave 155 propagates through the second transmission waveguide section 420 in a direction that is substantially parallel to the substrate 120 housed in the process chamber 160. The output end of the second transmission waveguide section 420 is coupled to an input port of the process chamber 160, and the travelling EM wave 155 propagates into the input port in a direction that is substantially parallel to the substrate 120.

The process chamber 160 houses the substrate 120 on top of a substrate holder 125 so the substrate 120 can be exposed to the travelling EM wave 155. The process chamber 160 includes a planar bottom surface 145. In an embodiment, the substrate 120 and the substrate holder 125 are located substantially coplanar with the planar bottom surface 145 of the process chamber 160 with a gap between the planar bottom surface 145 and the substrate 120. In another embodiment, the substrate 120 and the substrate holder 125 are located on the planar bottom surface 145 of the process chamber 160 without a gap between the substrate 120 and the planar bottom surface 145. In another embodiment, the substrate 120 is located on the planar bottom surface 145 so that the substrate 120 is above the planar bottom surface and the substrate holder 125 is located below the planar bottom surface 145.

The process chamber 160 houses the substrate 120 so that the substrate 120 may undergo adequate dopant activation with minimal thermal diffusion while being exposed to only low temperatures during the dopant activation. Advantageously, the low temperatures include those below 400 degrees Celsius, for example, below 300 degrees Celsius. The travelling EM wave 155 propagates through the process chamber 160 from the second transmission waveguide section 420 in a direction substantially parallel to the surface of the substrate 120. As the travelling EM wave 155 propagates through the process chamber 160, the non-nodes of the travelling EM wave 155 activate the dopants of the substrate 120 with minimal thermal diffusion.

In an embodiment, the substrate holder 125 cools the substrate 120 as the travelling EM wave 155 propagates through the process chamber 160 so that the substrate 120 is exposed to even lower temperatures as the substrate 120 undergoes dopant activation as compared to when the substrate 120 is exposed to the travelling EM wave 155 without the cooling provided by the substrate holder 125. As a result, substrates with temperature tolerances that are below the temperatures introduced to the substrates during the dopant activation with the travelling EM waves can still be used in the processing system 500 due to the substrate holder 125 cooling the substrates even further. In an embodiment, the substrate holder 125 cools the substrate 120 in any non-plasma EM wave treatment chamber and is not limited to cooling the substrate 120 while the substrate is exposed to travelling EM waves. For example, the substrate holder 125 cools the substrate in a conventional standing wave treatment chamber. In an embodiment, the substrate holder 125 may also warm the substrate 120 when the substrate 120 and/or the process chamber 160 have cooled beyond a threshold requiring that the substrate 120 be slightly warmed.

In an embodiment, the substrate holder 125 includes a clamping system (not shown) to improve thermal transfer between the substrate 120 and the substrate holder 125. The clamping system may include a mechanical clamping system or an electrical clamping system, such as an electrostatic (ESC) system. The clamping system may affix the substrate 120 to an upper surface of the substrate holder 125. For example, the clamping system may include a mechanical cooling/heating clamp to cool the substrate 120 as the substrate 120 is exposed to the travelling EM wave 155 as well as to heat the substrate 120 when necessary. In another embodiment, the substrate holder includes an ESC chuck that includes a cooling system to cool the substrate 120 as the substrate 120 is exposed to the travelling EM wave 155 as well as a heating system to heat the substrate 120 when necessary. The substrate holder 125 can include any type of cooling and/or heating apparatus that cools and/or heats the substrate 120 as the substrate is exposed to the travelling EM wave 155 that will be apparent to those skilled in the relevant art(s) without departing from the scope of the present invention.

A substrate temperature control system (not shown) may be coupled to the substrate holder 125 to adjust the temperature of the substrate 120. The substrate temperature control system includes temperature control elements. The temperature control elements may include a cooling system to re-circulate coolant flow after receiving heat from the substrate holder 125 and transfer the heat to a heat exchanger system. The temperature control elements may also transfer heat from the heat exchanger system when heating the substrate holder 125. The temperature control elements may control the temperature of the substrate holder 125 so that the temperature of the substrate 120 is adjusted from the center of the substrate 120 to the edge of the substrate 120. The temperature control elements may include but are not limited to resistive heating/cooling elements, thermo-electric heaters/coolers and/or any other type of temperature control elements to control the temperature of the substrate holder 125 that will be apparent to those skilled in the relevant art(s) without departing from the scope of the present disclosure.

As the travelling EM wave 155 propagates through the process chamber 160, a first reception waveguide section 570 receives the travelling EM wave 155 and removes the travelling EM wave 155 from the process chamber 160. An input end of the first reception waveguide section 570 is coupled to an output port of the process chamber 160. The first reception waveguide section 570 is substantially orthogonal to a second reception waveguide section 580. As a result, the travelling EM wave 155 propagates through the first reception waveguide section 570 in a direction substantially parallel to the substrate 120 and progressively bends to being substantially orthogonal to the second reception waveguide section 580 in a curved transition. An output section of the first reception waveguide section 570 is coupled to an input section of the second reception waveguide section 580. The travelling EM wave 155 progressively bends substantially 90 degrees in a curved transition as the travelling EM wave 155 propagates through the output section of the first reception waveguide 570 into the input section of the second reception waveguide 580.

After the travelling EM wave 155 progressively bends substantially 90 degrees in a curved transition, the travelling EM wave 155 propagates through the second reception waveguide section 580 in a direction that is substantially orthogonal to the first reception waveguide section 570. An EM wave receiving antenna 590 receives the travelling EM wave 155 as the travelling EM wave 155 propagates through the second reception waveguide section 580.

In an embodiment, the EM wave receiving antenna 590 radiates the travelling EM wave 155 into a circulation waveguide 595. The circulation waveguide 595 circulates the travelling EM wave 155 from the EM wave receiving antenna 590 to the circulator 520 so that the travelling EM wave 155 may be recycled. In other words, the circulation waveguide 595 circulates the travelling EM wave 155 back to the circulator 520 so that the circulator 520 may introduce the travelling EM wave 155 back into the process chamber 160 to again expose the substrate 120 to the travelling EM wave 155. An input end of the circulation waveguide 595 is coupled to the EM wave receiving antenna 590 and an output end of the circulation waveguide 595 is coupled to the circulator 520. The travelling EM wave 155 propagates through the circulation waveguide 595 from the EM receive antenna 590 to the EM wave transmission antenna 510.

Figure 6:
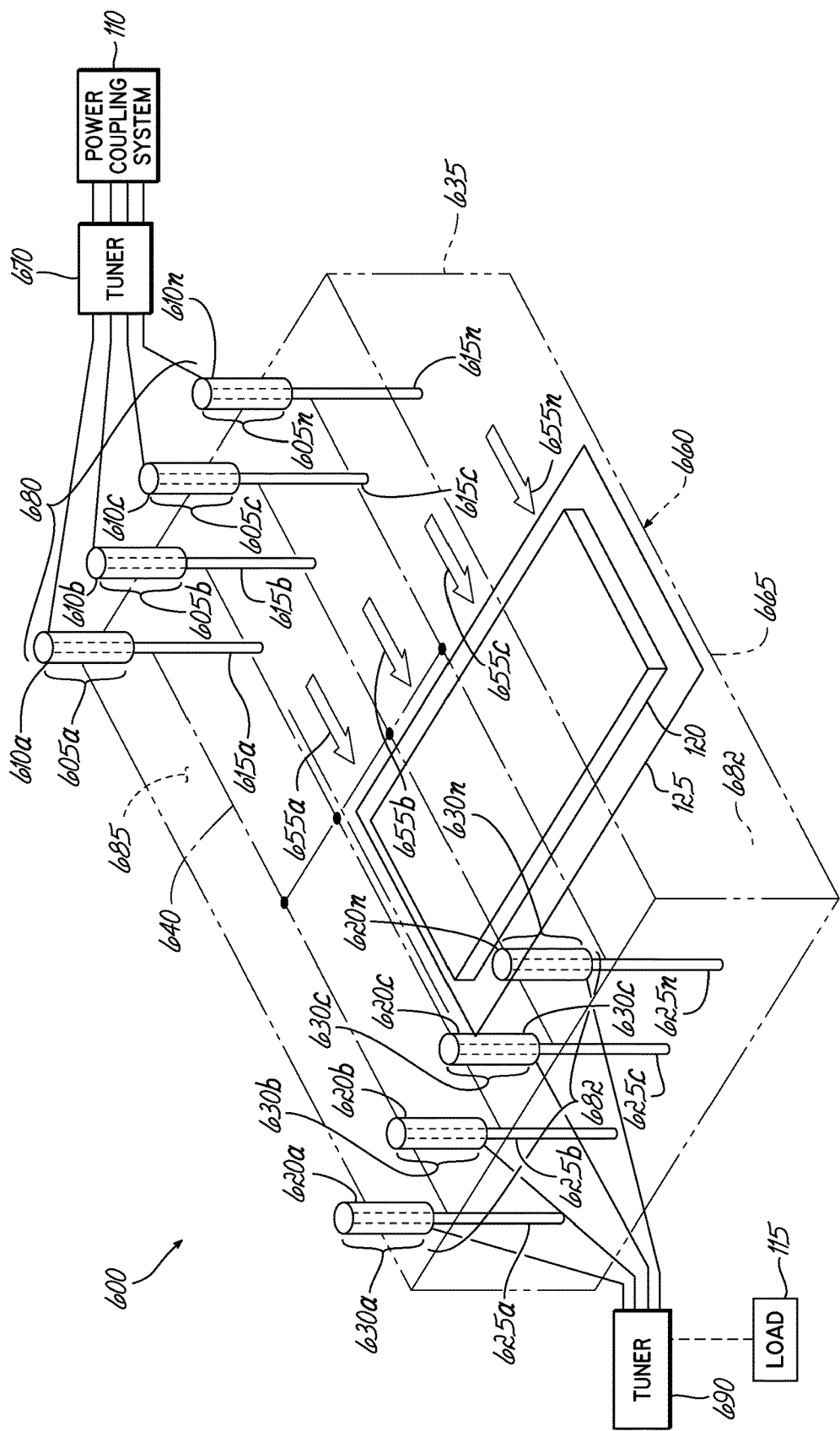
FIG. 6 illustrates an exemplary processing system for EM wave treatment of a substrate in accordance with an embodiment of the invention.

Referring now to FIG. 6, in which like reference numerals are used to refer to like parts, a processing system 600 is shown to illustrate one possible configuration of a processing system for EM wave treatment of a substrate. The processing system 600 shares may similar features with the processing system 100, the processing system 300, and the processing system 500; therefore, only the differences between the processing system 600 and the processing systems 100, 300, and 500 are to be discussed in further detail.

The power coupling system 110 provides input EM energy into an EM wave transmission antenna 680. The EM wave transmission antenna 680 includes a plurality of coaxial waveguides 605a through 605n where n is an integer equal to or greater than one. Each coaxial waveguide 605a through 605n includes a respective inner conductor 615a through 615n where n is an integer equal to or greater than one and also a respective outer conductor 610a through 610n where n is an integer equal to or greater than one.

Each outer conductor 610a through 610n is positioned outside of a process chamber 660. The process chamber includes a planar bottom surface 665 and a planar top surface 685 where the planar top surface 685 opposes the planar bottom surface 665. Each outer conductor 610a through 610n extends to the top planar surface 685 on the outside of the process chamber 660 and is coupled to a grounding configuration 640. The grounding configuration 640 acts substantially as an electrical ground for the processing system 600.

Each inner conductor 615a through 615n extends from the top of each respective outer conductor 610a through 610n down into the process chamber 660. Thus, each inner conductor 615a through 615n is located within each respective outer conductor 610a through 610n until each outer conductor 610a through 610n terminates at the top planar surface 685 at which point each inner conductor 615a through 615n continues to extend into the process chamber 660.

Each inner conductor 615a through 615n is positioned within a threshold of a sidewall 635 of the process chamber 660 to prevent conversion of each travelling EM wave 655a through 655n to a conventional standing wave. Each travelling EM wave 655a through 655n converts to the conventional standing wave when each corresponding inner conductor 615a through 615n is positioned beyond a maximum threshold of the sidewall 635 of the process chamber 660 so that each inner conductor 615a through 615n is positioned a distance that exceeds the appropriate distance from the sidewall 635. Each travelling wave 655a through 655n also converts to the conventional standing wave when each corresponding inner conductor is positioned beyond a minimum threshold of the sidewall 635 of the process chamber 660 so that each inner conductor 615a through 615n is positioned a distance that fails to reach the appropriate distance from the sidewall 635. The sidewall 635 extends between the planar bottom surface 665 of the process chamber 660 and the planar top surface 685 of the process chamber 660. Each coaxial waveguide 605a through 605n is also positioned within a threshold of each other coaxial waveguide 605a through 605n to minimize interference between each travelling EM wave 655a through 655n which also minimizes the conversion of each travelling EM wave 655a through 655n to the conventional standing wave. The distance that each inner conductor 615a through 615n extends into the process chamber 660 and the diameter of each inner conductor 615a through 615n may also be selected to minimize the conversion of each travelling EM wave 655a through 655n into the conventional standing wave based on the frequency that each travelling EM wave 655a through 655n propagates through the process chamber 660.

In the description that follows, the EM wave transmission antenna 680 that includes the plurality of coaxial waveguides 605a through 605n may be collectively referred to as an EM wave launcher. When energized, the power coupling system 110 generates EM energy into the EM wave transmission antenna 680 that radiates the EM energy as a plurality of travelling EM waves 655a through 655n where n is an integer equal to or greater than one. Each travelling EM wave 655a through 655n propagates through each respective inner conductor 615a through 615n and into the process chamber 660 where each inner conductor 615a through 615n is coupled to the planar bottom surface 665.

The process chamber 660 houses the substrate 120 so the substrate 120 can be exposed to the plurality of travelling EM waves 655a through 655n. The substrate is placed on top of the substrate holder 125. In an embodiment, the substrate 120 and the substrate holder 125 are located substantially coplanar with the planar bottom surface 665 of the process chamber 660 with a gap between the planar bottom surface 665 and the substrate 120. In another embodiment, the substrate 120 and the substrate holder 125 are located on the planar bottom surface 665 of the process chamber 660 without a gap between the substrate 120 and the planar bottom surface 665.

The plurality of travelling EM waves 655a through 655n propagates through the process chamber 660 from the EM wave launcher in a direction substantially parallel to the surface of the substrate 120. As the plurality of travelling EM waves 655a through 655n propagate through the process chamber 660, the non-nodes of each travelling EM wave 655a through 655n activate the dopants of the substrate 120 with minimal thermal diffusion.

In an embodiment, a tuner 670 adjusts the impedances of each coaxial waveguide 605a through 605n so that the impedances are substantially similar, and as a result, each travelling EM wave 655a through 655n is also substantially similar. Each travelling EM wave 655a through 655n operates in a substantially similar wave mode such as but not limited to having substantially similar frequency, amplitude, and/or phase. In another embodiment, tuner 670 adjusts the phase of each travelling EM wave 655a through 655n so that each operates in a substantially similar wave mode but each differs in phase.

In another embodiment, the tuner 670 adjusts the impedances of each coaxial waveguide 605a through 605n so that the impedance of each is different, and as a result, each travelling EM wave 655a through 655n is also different. Each travelling EM wave 655a through 655n operates in a different wave mode such as but not limited to having different frequency, amplitude, and/or phase.

As noted above, the EM wave launcher generates the plurality of travelling EM waves 655a through 655n. The surface of the substrate 120 is exposed to each of the travelling EM waves 655a through 655n. The exposure of the substrate 120 to each of the travelling EM waves 655a through 655n increases the likelihood that each portion of the surface of the substrate 120 is exposed to a travelling EM wave.

For example, the tuner 670 adjusts the impedance of each coaxial waveguide 605a through 605n to be substantially similar. The exposure of the substrate 120 to each of the travelling EM waves 655a through 655n that are substantially similar increases the likelihood that each portion of the surface of the substrate 120 is exposed to a travelling EM wave.

The tuner 670 also increases the control of the exposure of the surface of the substrate 120 to a travelling EM wave. The tuner 670 adjusts the impedance of each coaxial waveguide 605a through 605n to generate each travelling EM wave 655a through 655n, respectively, with EM wave mode characteristics tailored to the properties of the substrate 120.

For example, tuner 670 adjusts the impedance of coaxial waveguide 605a to differ from the impedance of coaxial waveguide 605n so that the travelling EM wave 655a and the travelling EM wave 655n are also different. A first portion of the surface of the substrate 120 is exposed to the travelling EM wave 655a while a second portion of the surface of the substrate 120 is exposed to the travelling EM wave 655n. The first portion includes properties different from the second portion, and as a result, the first portion is exposed to the travelling EM wave 655a having EM wave mode characteristics tailored to the properties included in the first portion while the second portion is exposed to the travelling EM wave 655n having EM wave mode characteristics tailored to the properties included in the second portion.

In an embodiment, the process chamber 660 houses several individual substrates rather than the single substrate 120. Each of the substrates is positioned in front of each respective coaxial waveguide 605a through 605n so that each of the substrates is exposed to a respective travelling EM wave 655a through 655n. The tuner 670 adjusts the impedances of each coaxial waveguide 605a through 605n so that each substrate is exposed to the respective travelling EM wave 655a through 655n having wave mode characteristics tailored to the properties included in that substrate.

As the plurality of travelling EM waves 655a through 655n propagate through the process chamber 660, an EM wave receiving antenna 682 receives the plurality of travelling EM waves 655a through 655n and removes them from the process chamber 660.

The EM wave receiving antenna 682 includes a plurality of coaxial waveguides 620a through 620n where n is an integer equal to or greater than one. Each coaxial waveguide 620a through 620n includes a respective inner conductor 625a through 625n where n is an integer equal to or greater than one and also a respective outer conductor 630a through 630n where n is an integer equal to or greater than one.

Each outer conductor 630a through 630n is positioned outside of the process chamber 660. Each outer conductor 630a through 630n extends to the top planar surface 685 on the outside of the process chamber 660. Each outer conductor 630a through 630n is coupled to the grounding configuration 640.

Each inner conductor 625a through 625n extends from the top of each respective outer conductor 630a through 630n down into the process chamber 660. Thus, each inner conductor 625a through 625n is located within each respective outer conductor 630a through 630n until each outer conductor 630a through 630n terminates at the top planar surface 685 at which point each inner conductor 625a through 625n continues to extend into the process chamber 660. The parameters associated with each coaxial waveguide 620a through 620n, such as the length that each inner conductor 625a through 625n extends into the process chamber 660, may be adjusted and/or determined in a similar fashion as discussed in detail above regarding coaxial waveguides 610a through 610n.

In the description that follows, the EM wave receiving antenna 682 that includes the plurality of coaxial waveguides 620a through 620n may be collectively referred to as an EM absorbing load. In an embodiment, the EM absorbing load absorbs the plurality of travelling EM waves 655a through 655n after the plurality of travelling EM waves 655a through 655n propagate through the process chamber 660. A tuner 690 adjusts the impedance of each coaxial waveguide 620a through 620n included in the EM wave receiving antenna 682 to match the impedance of each corresponding coaxial waveguide 605a through 605n included in the EM wave transmission antenna 680. The tuner 690 adjusts the impedance of each coaxial waveguide 620a through 620n to match the impedance of each corresponding coaxial waveguide 605a through 605n so that each coaxial waveguide 620a through 620n properly absorbs each corresponding travelling EM wave 655a through 655n.

For example, the tuner 690 adjusts the impedance of the coaxial waveguide 620a to match the impedance of the coaxial waveguide 605a so that the coaxial waveguide 620a properly absorbs the travelling EM wave 655a. The tuner 690 adjusts the impedance of the coaxial waveguide 620b to match the impedance of the coaxial waveguide 605b so that the coaxial waveguide 620b properly absorbs the travelling EM wave 655b. The tuner 690 adjusts the impedance of the coaxial waveguide 620c to match the impedance of the coaxial waveguide 605c so that the coaxial waveguide 620c properly absorbs the travelling EM wave 655c. The tuner 690 adjusts the impedance of the coaxial waveguide 620n to match the impedance of the coaxial waveguide 605n so that the coaxial waveguide 620n properly absorbs the travelling EM wave 655n.

Figure 7:
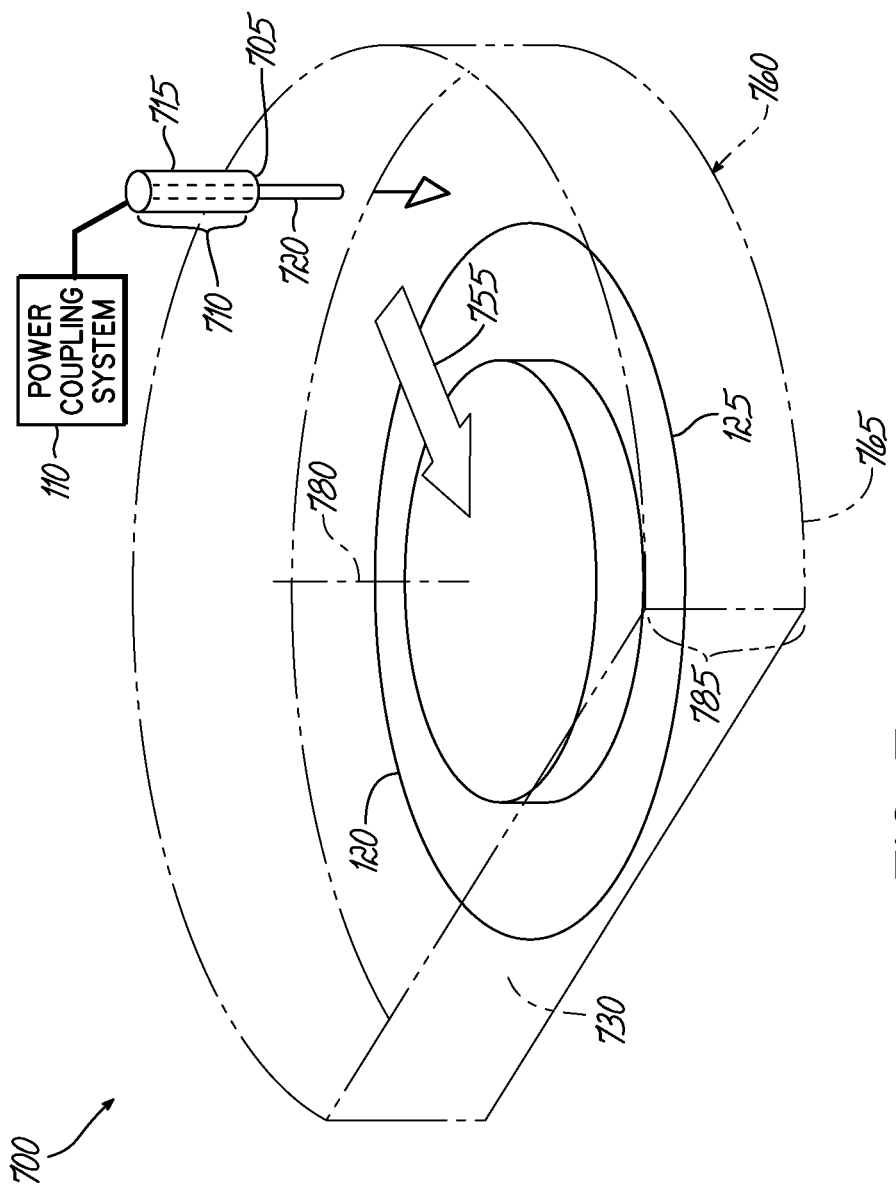
FIG. 7 illustrates an exemplary processing system for EM wave treatment of a substrate in accordance with an embodiment of the invention.

Referring now to FIG. 7, in which like reference numerals are used to refer to like parts, a processing system 700 is shown to illustrate one possible configuration of a processing system for EM wave treatment of a substrate. The processing system 700 shares many similar features with the processing systems 100, 300, 500, and 600; therefore, only the differences between the processing system 700 and the processing systems 100, 300, 500, and 600 are to be discussed in further detail.

The power coupling system 110 provides input energy into an EM wave transmission antenna 705. The EM wave transmission antenna 705 includes a coaxial waveguide 710. The coaxial waveguide 710 includes an inner conductor 720 and an outer conductor 715.

In the description that follows, the EM wave transmission antenna 705 that includes the coaxial waveguide 710 may be collectively referred to as an EM wave launcher. When energized, the power coupling system 110 generates EM energy into the EM wave transmission antenna 705 that radiates the EM energy as a travelling EM wave 755. The travelling EM wave 755 propagates through the inner conductor 720 and into a process chamber 760 where the inner conductor 720 extends into the process chamber 760.

The process chamber 760 houses the substrate 120 so the substrate 120 can be exposed to the travelling EM wave 755. The substrate 120 is placed on top of the substrate holder 125. In an embodiment, the substrate 120 and the substrate holder 125 are located substantially coplanar with the planar bottom surface 765 of the process chamber 760 with a gap between the planar bottom surface 765 and the substrate 120. In another embodiment, the substrate 120 and the substrate holder 125 are located on the planar bottom surface 765 of the process chamber 760 without a gap between the substrate 120 and the planar bottom surface 765.

The travelling EM wave 755 propagates through the process chamber 760 from the EM wave launcher in a direction substantially parallel to the surface of the substrate 120. As the travelling EM wave 755 propagates through the process chamber 760, the non-nodes of the travelling EM wave 755 activate the dopants of the substrate 120 with minimal thermal diffusion.

In an embodiment, the process chamber 760 is depicted as a circular chamber. The process chamber 760 includes a wide radius dimension 780 and also a shallow height 785. The wide radius dimension 780 and the shallow height 785 accompanied with circular chamber of the process chamber 760 maximize the exposure of the substrate 120 to the travelling EM wave 755. The wide radius dimension 780 and the shallow height 785 accompanied with the circular chamber of the process chamber 760 also provides control of the travelling EM wave 755 as the travelling EM wave 755 propagates through the process chamber 760.

As the travelling EM wave 755 propagates through the process chamber 760, an EM wave receiving antenna 730 receives the travelling EM wave 755 and removes it from the process chamber 760.

The EM wave receiving antenna 730 includes a rectangular waveguide. Although the EM wave transmission antenna 705 includes the coaxial waveguide 710, the EM wave receiving antenna 730 includes a rectangular waveguide that differs from the coaxial waveguide 710 of the EM wave transmission antenna 705. Thus, the EM wave receiving antenna 730 is not limited to including a waveguide that is substantially equivalent to the waveguide included in the EM wave transmission antenna 705. The impedance of the EM wave receiving antenna 730 matches the impedance of the EM wave transmission antenna 705. Thus, the waveguide included in the EM wave receiving antenna 730 and the waveguide included in the EM wave transmission antenna 705 can include any type of waveguide with impedances that match so that the EM wave receiving antenna 730 properly absorbs the travelling EM wave 755 generated by the EM wave transmission antenna 705 as will be apparent to those skilled in the relevant art(s) without departing from the scope of the present invention.

Figure 8:
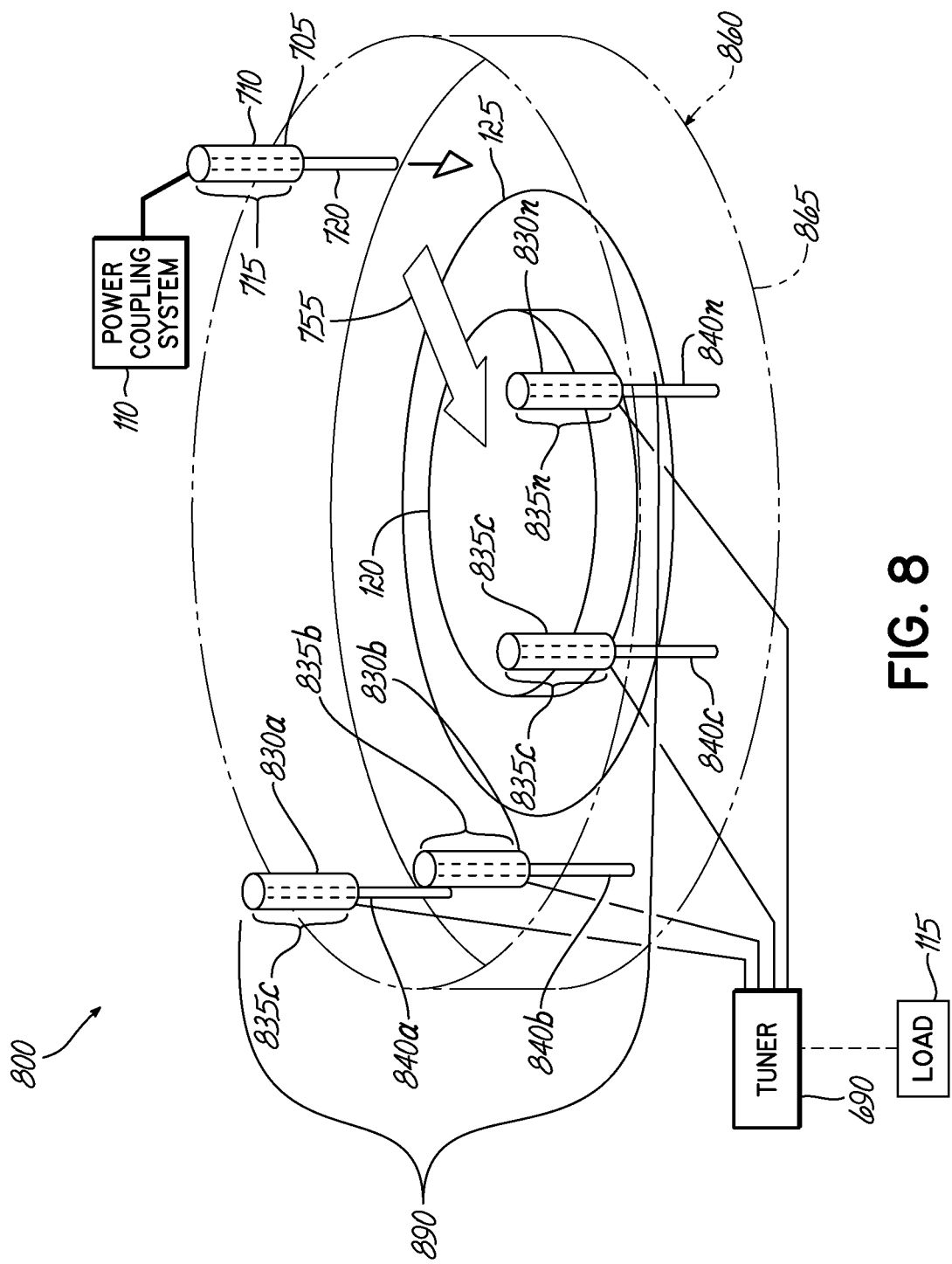
FIG. 8 illustrates an exemplary processing system for EM wave treatment of a substrate in accordance with an embodiment of the invention.

Referring now to FIG. 8, in which like reference numerals are used to refer to like parts, a processing system 800 is shown to illustrate one possible configuration of a processing system for EM wave treatment of a substrate. The processing system 800 shares many similar features with the processing system 100, the processing system 300, the processing system 500, the processing system 600, and the processing system 700; therefore only the differences between the processing system 800 and the processing systems 100, 300, 500, 600, and 700 are to be discussed in further detail.

The power coupling system 110 provides input energy into an EM wave transmission antenna 705. The EM wave transmission antenna 705 includes a coaxial waveguide 710. The coaxial waveguide includes an outer conductor 715 and an inner conductor 720. In the description that follows, the EM wave transmission antenna 705 that includes the coaxial waveguide 710 may be collectively referred to as an EM wave launcher. When energized, the power coupling system 110 generates EM energy into the EM wave transmission antenna 705 that radiates the EM energy as a travelling EM wave 755. The travelling EM wave 755 propagates through the inner conductor 720 and into the process chamber 860 where the inner conductor 720 extends into the process chamber 860.

The process chamber 860 houses the substrate 120 on a substrate holder 125 so the substrate 120 can be exposed to the travelling EM wave 755. In an embodiment, the substrate 120 and the substrate holder 125 are located substantially coplanar with the planar bottom surface 865 of the process chamber 860 with a gap between the planar bottom surface 865 and the substrate 120. In another embodiment, the substrate 120 and the substrate holder 125 are located on the planar bottom surface 865 of the process chamber 860 without a gap between the substrate 120 and the planar bottom surface 865.

The travelling EM wave 755 propagates through the process chamber 860 from the EM wave launcher in a direction substantially parallel to the surface of the substrate 120. As the travelling EM wave 755 propagates through the process chamber 860, the non-nodes of the travelling EM wave 755 activate the dopants of the substrate 120 with minimal thermal diffusion.

As the travelling EM wave 755 propagates through the process chamber 860, an EM wave receiving antenna 890 receives the travelling EM wave 755 and removes it from the process chamber 860.

The EM wave receiving antenna 890 includes a plurality of coaxial waveguides 830*a* through 830*n* where n is an integer equal to or greater than one. Each coaxial waveguide 830*a* through 830*n* includes a respective inner conductor 840*a* through 840*n* where n is an integer equal to or greater than one and also a respective outer conductor 835*a* through 835*n* where n is an integer equal to or greater than one.

In the description that follows, the EM wave receiving antenna 890 that includes the plurality of coaxial waveguides 830*a* through 830*n* may be collectively referred to as an EM absorbing load. In an embodiment, the EM absorbing load absorbs the travelling EM wave 755 after the travelling EM wave 755 propagates through the process chamber 860. The tuner 690 adjusts the impedance of each coaxial waveguide 830*a* through 830*n* included in the EM wave receiving antenna 890 to match the impedance of the coaxial waveguide 710 of the EM wave transmission antenna 705. The tuner 690 adjusts the impedance of each coaxial waveguide 830*a* through 830*n* to match the impedance of the coaxial waveguide 710 to properly absorb the travelling EM wave 755.

The EM wave receiving antenna 890 is not limited to a quantity of waveguides that is substantially equivalent to the quantity of waveguides included in the EM wave transmission antenna 705 as long as the impedance of each waveguide included in the EM wave receiving antenna 890 matches each corresponding waveguide included in the EM wave transmission antenna 705. Thus, the quantity of waveguides included in the EM wave receiving antenna 890 and the quantity of waveguides included in the EM wave transmission antenna 705 can include any quantity of waveguides with impedances that match so that the EM wave receiving antenna 890 properly absorbs the travelling EM waves generated by the EM wave transmission antenna 705 as will be apparent to those skilled in the relevant art(s) without departing from the scope of the present invention.

Figure 9:
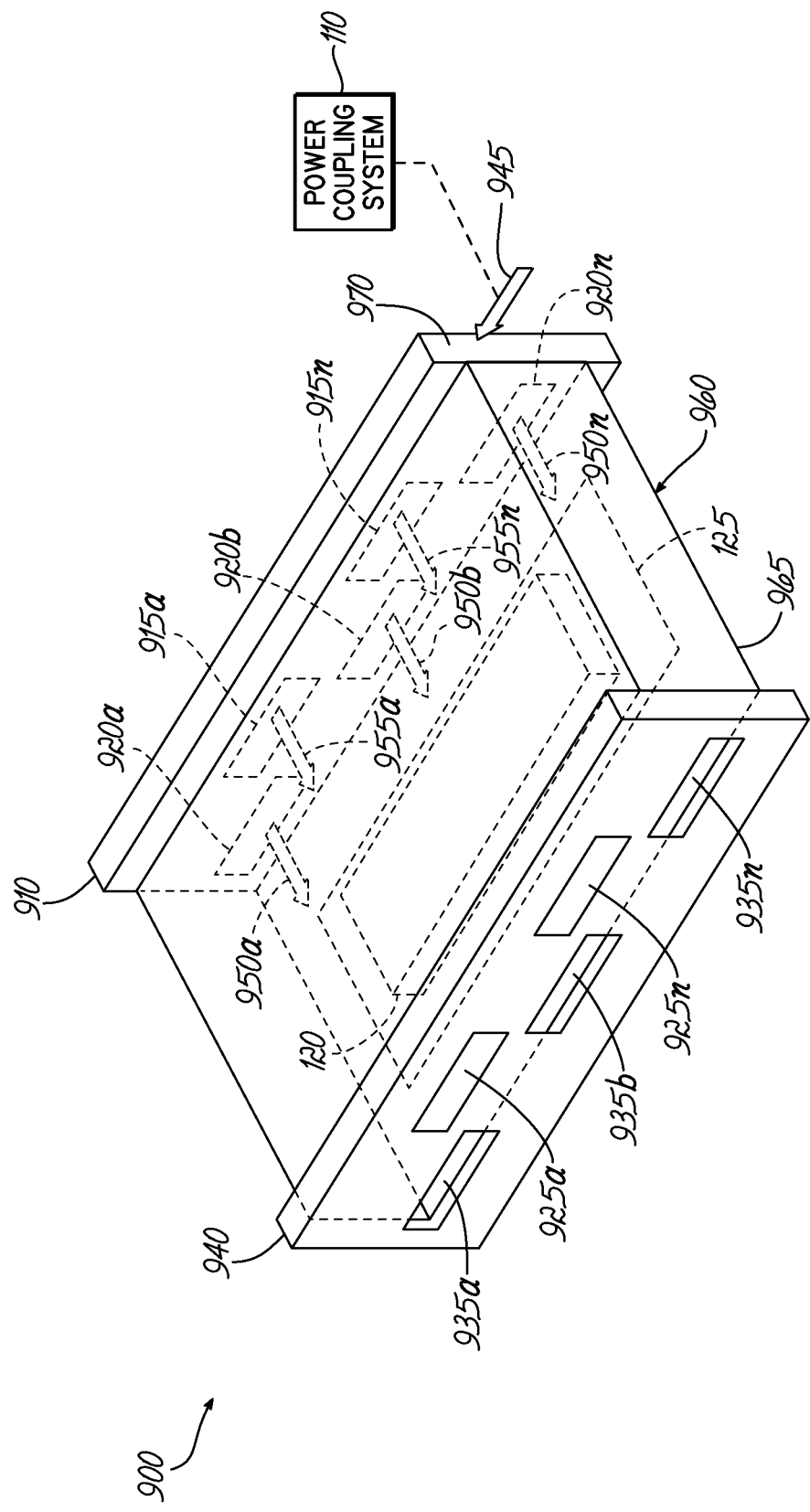
FIG. 9 illustrates an exemplary processing system for EM wave treatment of a substrate in accordance with an embodiment of the invention.

Referring now to FIG. 9, in which like reference numerals are used to refer to like parts, a processing system 900 is shown to illustrate one possible configuration of a processing system for EM wave treatment of a substrate. The processing system 900 shares many similar features with the processing system 100, the processing system 300, the processing system 500, the processing system 600, the processing system 700, and the processing system 800; therefore, only the differences between the processing system 900 and the processing systems 100, 300, 500, 600, 700, and 800 are to be discussed in further detail.

The power coupling system 110 provides input EM energy into an EM wave transmission antenna 910. The EM wave transmission antenna 910 is a slot antenna with a first plurality of transmission slots 915a through 915n where n is an integer equal to or greater than one and a second plurality of transmission slots 920a through 920n where n is an integer equal to or greater than one. In an embodiment, the first plurality of transmission slots 915a through 915n is located a first height from a planar bottom surface 965 of the process chamber 960 and the second plurality of transmission slots 920a through 920n is located a second height from the planar bottom surface 965 of the process chamber 960 where the first height is greater than the second height. In another embodiment, the first plurality of transmission slots 915a through 915n and the second plurality of transmission slots 920a through 920n are located at a substantially equivalent height from the planar bottom surface 965 of a process chamber 960. In an embodiment, the EM wave transmission antenna 910 is a RLSA. However, the EM wave transmission antenna 910 may include any type of slot antenna as will be apparent to those skilled in the relevant art(s) without departing from the scope of the present invention.

In the description that follows, the EM wave transmission antenna 910 may be collectively referred to as an EM wave launcher. When energized, the power coupling system 110 generates EM energy into a travelling wave supply end 970 of the EM wave transmission antenna 910 that radiates as a travelling EM wave 945 into the EM wave transmission antenna 910. The travelling EM wave 945 passes through each first transmission slot 915a through 915n and becomes a first plurality of travelling EM waves 955a through 955n where n is an integer that is substantially equivalent to the integer of the first plurality of slots 915n. The travelling EM wave 945 also passes through each second transmission slot 920a through 920n and becomes a second plurality of travelling EM waves 950a through 950n where n is an integer that is substantially equivalent to the integer of the second plurality of slots 920n.

In an embodiment, the first plurality of travelling EM waves 955a through 955n and the second plurality of travelling EM waves 950a through 950n radiate into the process chamber 960 at different heights relative to the planar bottom surface 965 of the process chamber 960. Each first travelling EM wave 955a through 955n radiates through each respective first transmission slot 915a through 915n at the first height from the planar bottom surface 965 of the process chamber 960. Each second travelling EM wave 950a through 950n radiates through each respective second transmission slot 920a through 920n at the second height from the planar bottom surface 965 of the process chamber 960. In such an embodiment, the first height is greater than the second height. In another embodiment, the first plurality of travelling EM waves 955a through 955n and the second plurality of travelling EM waves 950a through 950n radiates through each respective slot at a substantially equivalent height from the planar bottom surface 965 of the process chamber 960.

As noted above regarding the discussion of FIG. 1, a vacuum seal of the process chamber 960 may be desired. In such an embodiment, a hermetic seal may be associated with each first transmission slot 915a through 915n and each second transmission slot 920a through 920n. An example of a hermetic seal may include a dielectric window (not shown) that is associated with each first transmission slot 915a through 915n and each second transmission slot 920a through 920n. Each first transmission slot 915a through 915n and each second transmission slot 920a through 920n may be mated with a sidewall of a process chamber 960, to provide a hermetic seal for the process chamber 960, the EM wave transmission antenna 910 and a portal for transmission of each first travelling EM wave 955a through 955n and each second travelling EM wave 950a through 950n into the process chamber 960.

The process chamber 960 houses the substrate 120 on top of the substrate holder 125 so the substrate 120 can be exposed to the first plurality of travelling EM waves 955a through 955n and the second plurality of travelling EM waves 950a through 950n. In an embodiment, the substrate 120 and the substrate holder 125 are located substantially coplanar with the planar bottom surface 965 of the process chamber 960 with a gap between the planar bottom surface 965 and the substrate 120. In another embodiment, the substrate 120 and the substrate holder 125 are located on the planar bottom surface 965 of the process chamber 960 without a gap between the substrate 120 and the planar bottom surface 965.

The first plurality of travelling EM waves 955a through 955n and the second plurality of travelling EM waves 950a through 950n propagate through the process chamber 960 from the EM wave launcher in a direction substantially parallel to the surface of the substrate 120. As the first plurality of travelling EM waves 955a through 955n and the second plurality of travelling EM waves 950a through 950n propagate through the process chamber 960, the non-nodes of each first travelling EM wave 955a through 955n and the non-nodes of each second travelling EM wave 950a through 950n activate the dopants of the substrate 120 with minimal thermal diffusion.

The first plurality of transmission slots 915a through 915n and the second plurality of transmission slots 920a through 920n are positioned to increase the control with which the surface of the substrate 120 is exposed to a travelling EM wave. The first plurality of transmission slots 915a through 915n and the second plurality of transmission slots 920a through 920n are positioned so that the EM wave mode characteristics of the first plurality of travelling EM waves 955a through 955n and the EM wave mode characteristics of the second plurality of travelling EM waves 950a through 950n are tailored to the properties of the substrate 120.

For example, the difference in height positioning of the first plurality of transmission slots 915a through 915n and the second plurality of transmission slots 920a through 920n generates different EM wave mode characteristics for the first plurality of travelling EM waves 955a through 955n and the second plurality of travelling EM waves 950a through 950n. A first portion of the surface of the substrate 120 is exposed to the second travelling EM wave 950a, which propagates across the surface of the substrate 120 at the second height. A second portion of the surface of the substrate 120 is exposed to the first travelling EM wave 955a, which propagates across the surface of the substrate 120 at the first height. The first portion includes properties different from the second portion. The difference in the propagation of the second travelling EM wave 950a propagating at the second height and the propagation of the first travelling EM wave 955a propagating at the first height results in different EM wave mode characteristics for the second travelling EM wave 950a and the first travelling EM wave 955a. As a result, the first portion is exposed to the second travelling EM wave 950a propagating at the second height with EM wave mode characteristics tailored to the properties included in the first portion. The second portion is exposed to the first travelling EM wave 955a propagating at the first height with EM wave mode characteristics tailored to the properties included in the first portion.

In an embodiment, the process chamber 960 houses several individual substrates rather than the single substrate 120 where each substrate is positioned on a substrate holder on the planar bottom surface 965 of the process chamber 960. Each of the substrates is positioned in front of each respective first transmission slot 915a through 915n and/or each respective second transmission slot 920a through 920n. Each first transmission slot 915a through 915n and each second transmission slot 920a through 920n are positioned so that each substrate is exposed to each respective first travelling EM wave 955a through 955n and/or each respective second travelling EM wave 950a through 950n where each has wave mode characteristics tailored to the properties included in each substrate.

In an embodiment, the process chamber 960 houses several individual substrates rather than the single substrate 120 where each substrate is stacked on top of each other. In such an embodiment, the first substrate is located on the planar bottom surface 965 of the process chamber and then each subsequent substrate is stacked on top of each other so that each subsequent substrate is located a height above the planar bottom surface 965. The first plurality of transmission slots 915a through 915n and the second plurality of transmission slots 920a through 920n are positioned to increase the control with which the surface of each substrate is exposed to a travelling EM wave.

For example, the substrate 120 is located on the planar bottom surface 965 of the process chamber 960 where the surface of the substrate 120 is located at the second height from the planar bottom surface 965. A second substrate is stacked on top of the substrate 120 where the surface of the second substrate is located at the first height from the planar bottom surface 965. The surface of the substrate 120 is exposed to the second plurality of travelling EM waves 950a through 950n. The second plurality of travelling EM waves 950a through 950n propagate out of the second plurality of transmission slots 920a through 920n located at the second height and then propagate through the process chamber 960 at the second height. The surface of the second substrate is exposed to the first plurality of travelling EM waves 955a through 955n. The first plurality of travelling EM waves 955a through 955n propagate out of the first plurality of transmission slots 915a through 915n located at the first height and then propagate through the process chamber 960 at the first height.

As the first plurality of travelling EM waves 955a through 955n and the second plurality of travelling EM waves 950a through 950n propagate through the process chamber 960, an EM wave receiving antenna 940 receives the first plurality of travelling EM waves 955a through 955n and the second plurality of travelling EM waves 950a through 950n. The EM wave receiving antenna 940 removes the first plurality of travelling EM waves 955a through 955n and the second plurality of travelling EM waves 950a through 950n from the process chamber 960.

The EM wave receiving antenna 940 includes a first plurality of receiving slots 925a through 925n where n is an integer that is substantially equivalent to the first transmission slot 915n and a second plurality of receiving slots 935a through 935n where n is an integer substantially equivalent to the second transmission slot 920n. In the description that follows, the EM wave receiving antenna 940 may be collectively referred to as an EM absorbing load. In an embodiment, the EM absorbing load absorbs the first plurality of travelling EM waves 955a through 955n and the second plurality of travelling EM waves 950a through 950n after the first plurality of travelling EM waves 955a through 955n and the second plurality of travelling EM waves 950a through 950n propagate through the process chamber 960.

Each first plurality of receiving slots 925a through 925n is positioned to face each corresponding first transmission slot 915a through 915n. For example, the first receiving slot 925a is positioned at the first height from the planar bottom surface 965 so that the first receiving slot 925a is facing the first transmission slot 915a. Each second plurality of receiving slots 935a through 935n is positioned to face each corresponding second transmission slot 920a through 920n. For example, the second receiving slot 935a is positioned at the second height from the planar bottom surface so that the second receiving slot 935a is facing the second transmission slot 920a.

Each first receiving slot 925a through 925n is positioned to face each corresponding first transmission slot 915a through 915n so that each first receiving slot 925a through 925n absorbs each respective first travelling EM wave 955a through 955n as each respective first travelling EM wave 955a through 955n propagates through the process chamber 960. For example, the first receiving slot 925n is positioned at the first height to face the first transmission slot 915n so that the first receiving slot 925n absorbs the first travelling EM wave 955n as the first travelling EM wave 955n propagates through the process chamber 960.

Each second receiving slot 935a through 935n is positioned to face each corresponding second transmission antenna 920a through 920n so that each second receiving slot 935a through 935n absorbs each respective second travelling EM wave 950a through 950n as each respective second travelling EM wave 950a through 950n propagates through the process chamber 960. For example, the second receiving slot 935b is positioned at the second height to face the second transmission slot 920b so that the second receiving slot 935b absorbs the second travelling EM wave 950b as the second travelling EM wave 950b propagates through the process chamber 960. After the plurality of the first travelling EM waves 955a through 955n and the second travelling EM waves 950a through 950n have been absorbed by the EM wave receiving antenna 940, the EM wave receiving antenna discharges the travelling EM wave 975 out of the EM wave receiving antenna 940.

In an embodiment, the EM absorbing load is not limited to including a line slot antenna to match the line slot antenna included in the EM wave launcher. The EM absorbing load can include any type of antenna design with any type of waveguide design with impedance that matches the impedance of the EM wave launcher. For example, the EM absorbing load can include but is not limited to a dipole antenna, a yagi antenna, a whip antenna, a phased array antenna, a loop antenna, a slot antenna, a RLSA and/or any other type of antenna designed with impedance that matches the impedance of the EM wave launcher that will be apparent to those skilled in the relevant art(s) without departing from the scope of the present invention. In another example, the EM absorbing load can include but is not limited to a spherical waveguide, a coaxial waveguide, a fiber optical waveguide, and/or any other type of waveguide designed with impedance that matches the impedance of the EM wave launcher that will be apparent to those skilled in the relevant art(s) without departing from the scope of the present invention.

Figure 10:
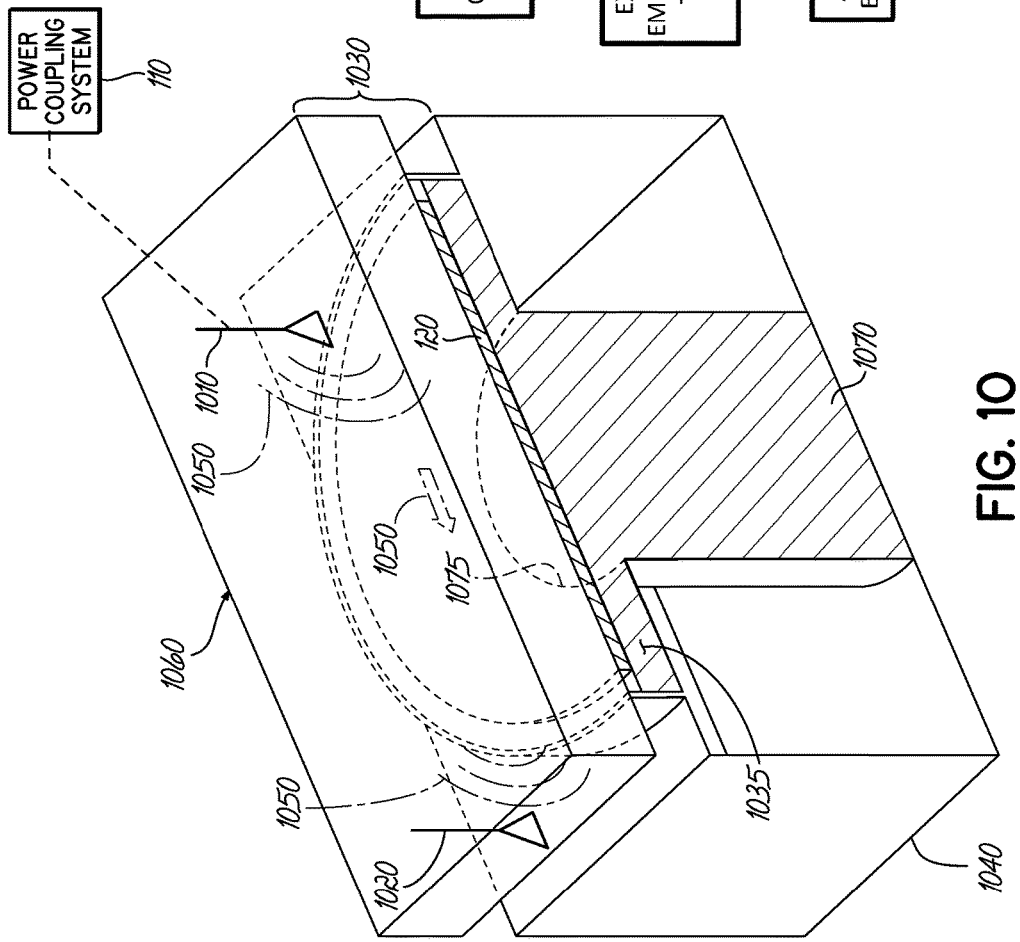
FIG. 10 illustrates an exemplary processing system for EM wave treatment of a substrate in accordance with an embodiment of the invention.

Referring now to FIG. 10, in which like reference numerals are used to refer to like parts, a processing system 1000 is shown to illustrate one possible configuration of a processing system for EM wave treatment of a substrate. The processing system 1000 shares many similar features with the processing systems 100, 300, 500, 600, 700, 800, and 900; therefore, only the differences between the processing system 1000 and the processing systems 100, 300, 500, 600, 700, 800 and 900 are to be discussed in further detail.

The power coupling system 110 provides input EM energy into an EM wave transmission antenna 1010. In the description that follows, the EM wave transmission antenna 1010 may be collectively referred to as an EM wave launcher. When energized, the power coupling system 110 generates EM energy into the EM wave transmission antenna 1010 that radiates a travelling EM wave 1050 into an upper chamber section 1030 that is included in a process chamber 1060.

The process chamber 1060 houses the substrate 120 so the substrate 120 can be exposed to the travelling EM wave 1050. The process chamber 1060 includes the upper chamber section 1030 and a lower chamber section 1040. The upper chamber section 1030 is coupled to the EM wave transmission antenna 1010 and houses the substrate 120 when the substrate 120 is exposed to the travelling EM wave 1050 to activate the dopants of the substrate 120. The lower chamber section 1040 is isolated from the travelling EM wave 1050. The lower chamber section 1040 houses the substrate 120 when the substrate 120 does not require dopant activation so the substrate 120 is isolated from the travelling EM wave 1050.

The substrate 120 is placed on top of a substrate holder 1070. The substrate holder 1070 transports the substrate 120 vertically into the upper chamber section 1030 from the lower chamber section 1040 through an opening 1075 located in the planar bottom surface 1035 of the upper chamber section 1030. The substrate holder 1070 transports the substrate 120 from the lower chamber section 1040 into the upper chamber section 1030 when the substrate 120 requires dopant activation so the substrate can be exposed to the travelling EM wave 1050. The substrate holder 1070 raises the substrate 120 into the upper chamber section 1030 so that the substrate 120 is positioned on a planar bottom surface 1035 of the upper chamber section 1030. The travelling EM wave 1050 propagates through the upper chamber section 1030 from the EM wave launcher in a direction substantially parallel to the surface of the substrate 120. Examples of the upper chamber section may include but are not limited to processing systems 100, 300, 500, 600, 700, 800, and/or 900. In an embodiment, the substrate holder 1070 cools the substrate 120 as the travelling EM wave 1050 propagates through the upper chamber section 1030 so that the substrate 120 is exposed to even lower temperatures as the substrate 120 undergoes dopant activation as compared to when the substrate 120 is exposed to the travelling EM wave 1050 without the cooling provided by the substrate holder 1070. As a result, substrates with temperature tolerances that are below the temperatures introduced to the substrates during the dopant activation with the travelling EM waves can still be used in the processing system 1000 due to the substrate holder 1070 cooling the substrates even further. In an embodiment, the substrate holder 1070 cools the substrate 120 in any non-plasma EM wave treatment chamber and is not limited to cooling the substrate 120 while the substrate is exposed to travelling EM waves. For example, the substrate holder 1070 cools the substrate in a conventional standing wave treatment chamber. In an embodiment, the substrate holder 1070 may also warm the substrate 120 when the substrate 120 and/or the process chamber 1060 have cooled beyond a threshold requiring that the substrate 120 be slightly warmed.

In an embodiment, the substrate holder 1070 includes a clamping system (not shown) to improve thermal transfer between the substrate 120 and the substrate holder 1070. The clamping system may include a mechanical clamping system or an electrical clamping system, such as an electrostatic (ESC) system. The clamping system may affix the substrate 120 to an upper surface of the substrate holder 1070. For example, the clamping system may include a mechanical cooling/heating clamp to cool the substrate 120 as the substrate 120 is exposed to the travelling EM wave 1050 as well as to heat the substrate 120 when necessary. In another embodiment, the substrate holder includes an ESC chuck that includes a cooling system to cool the substrate 120 as the substrate 120 is exposed to the travelling EM wave 1050 as well as a heating system to heat the substrate 120 when necessary. The substrate holder 1070 can include any type of cooling and/or heating apparatus that cools and/or heats the substrate 120 as the substrate is exposed to the travelling EM wave 1050 that will be apparent to those skilled in the relevant art(s) without departing from the scope of the present invention.

A substrate temperature control system (not shown) may be coupled to the substrate holder 1070 to adjust the temperature of the substrate 120. The substrate temperature control system includes temperature control elements. The temperature control elements may include a cooling system to re-circulate coolant flow after receiving heat from the substrate holder 1070 and transfer the heat to a heat exchanger system. The temperature control elements may also transfer heat from the heat exchanger system when heating the substrate holder 1070. The temperature control elements may control the temperature of the substrate holder 1070 so that the temperature of the substrate 120 is adjusted from the center of the substrate 120 to the edge of the substrate 120. The temperature control elements may include but are not limited to resistive heating/cooling elements, thermo-electric heaters/coolers and/or any other type of temperature control elements to control the temperature of the substrate holder 1070 that will be apparent to those skilled in the relevant art(s) without departing from the scope of the present disclosure.

As the travelling EM wave 1050 propagates through the upper chamber section 1030, the non-nodes of the travelling EM wave 1050 activate the dopants of the substrate 120 with minimal thermal diffusion. The substrate holder 1070 rotates the substrate 120 as the travelling EM wave 1050 propagates across the surface of the substrate 120. The substrate holder 1070 rotates the substrate 120 to increase the likelihood that each portion of the surface of the substrate 120 is exposed to the non-nodes of travelling EM wave 1050 to increase the dopant activation of the substrate 120.

After the dopant activation for the substrate 120 has been completed, the substrate holder 1070 lowers the substrate 120 vertically from the upper chamber 1040 through the opening 1075 of the upper chamber section 1030 into the lower chamber 1040. The substrate 120 is isolated from the travelling EM wave 1050 when located within the lower chamber 1040.

As the travelling EM wave 1050 propagates through the upper chamber section 1040, an EM wave receiving antenna 1020 receives the travelling EM wave 1050. The EM wave receiving antenna 1020 removes the travelling EM wave from the upper chamber section 1030. The EM wave receiving antenna 1020 may be collectively referred to as an EM absorbing load.

Figure 11:
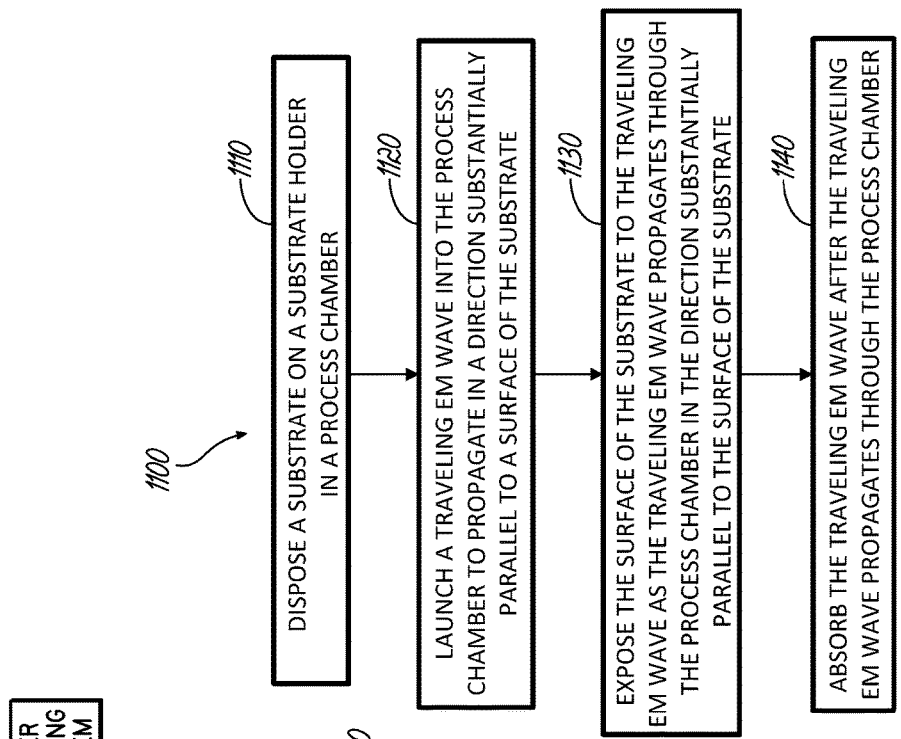
FIG. 11 is a flowchart of exemplary operational steps of a processing system according to an exemplary embodiment of the present invention.

FIG. 11 is a flowchart of exemplary operational steps of a processing system according to an exemplary embodiment of the present invention. The present invention is not limited to this operational description. Rather, it will be apparent to persons skilled in the relevant art(s) from the teaching herein that other operational control flows are within the scope and spirit of the present invention. The following discussion describes the steps in FIG. 11.

At step 1110, the operational control flow disposes a substrate on a substrate holder in a process chamber.

At step 1120, the operational control flow launches a travelling EM wave into the process chamber to propagate in a direction substantially parallel to the surface of the substrate. For example, the operational control flow provides an EM wave launcher that includes an EM wave transmission antenna 130 and a waveguide 140. The EM wave transmission antenna 130 launches a travelling EM wave 155 into a process chamber 160 for the travelling EM wave 155 to propagate in a direction substantially parallel to the surface of the substrate 120. The travelling EM wave 155 activates dopants included in the substrate 120.

At step 1130, the operational control flow exposes the surface of the substrate to the travelling EM wave as the travelling EM wave propagates through the process chamber in the direction substantially parallel to the surface of the substrate. Specifically, the surface of the substrate 120, for example, is exposed to the travelling EM wave 155 as the travelling EM wave 155 propagates through the process chamber 160 in the direction substantially parallel to the surface of the substrate 120.

At step 1140, the operational control flow absorbs the travelling EM wave after the travelling EM wave propagates through the process chamber. Specifically, an EM absorbing load includes an EM wave receiving antenna 190 and a waveguide 180, for example. The EM wave receiving antenna 190 absorbs the travelling EM wave 155 after the travelling EM wave 155 propagates through the process chamber 160.

It is to be appreciated that the Detailed Description section, and not the Abstract section, is intended to be used to interpret the claims. The Abstract section can set forth one or more, but not all exemplary embodiments, of the present invention, and thus, are not intended to limit the present invention and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A processing system for electromagnetic (EM) wave treatment of a substrate, comprising:
    a process chamber configured to define a process space to house a substrate for exposure of a surface of the substrate to a travelling EM wave, the process chamber having an input port and an output port;
    a substrate holder positioned in the process space configured to hold a substrate and directly expose the substrate to the process space;
    an EM wave launcher system coupled to the input port and including an EM wave transmission antenna and a transmission waveguide and being configured to launch the travelling EM wave from the transmission waveguide directly into the input port of the process chamber and directly into the process space for the travelling EM wave to directly engage the substrate on the substrate holder and propagate in a direction substantially parallel to the surface of the substrate, wherein the transmission antenna includes an output end coupled to the transmission waveguide and the transmission waveguide is coupled directly to the input port of the process chamber;
    a power coupling system configured to supply EM energy to the EM wave transmission antenna to generate the travelling EM wave at a prescribed output power and in a prescribed EM wave mode during treatment of the substrate, wherein the power coupling system is coupled to an input end of the transmission antenna; and
    an EM wave absorbing load system coupled to the output port and including an EM wave receiving antenna, an EM wave absorbing load and a receiving waveguide, wherein the EM wave receiving antenna includes an input end that is coupled to the receiving waveguide and the receiving waveguide is coupled directly to the output port of the process chamber;
    the EM wave absorbing load system being configured to:
    substantially absorb all of the travelling EM wave launched by the EM wave launcher system after propagation through the process chamber and propagation directly into the receiving waveguide so the EM wave is absorbed by the EM wave absorbing load for effectively removing the EM wave from the process chamber; and
    minimize the reflections of the travelling EM wave back into the process chamber due to the substantial absorption of the travelling EM wave by the EM wave absorbing load.

2. The processing system of claim 1, wherein the power coupling system is further configured to generate the travelling EM wave at a microwave frequency in a range of 1 GHz to 100 GHz.

3. The processing system of claim 1, wherein the EM wave transmission antenna comprises:
a first EM wave transmission antenna configured to launch a first travelling EM wave into a first location in the process chamber; and
a second EM wave transmission antenna configured to launch a second travelling EM wave into a second location in the process chamber.

4. The processing system of claim 3, wherein the power coupling system is further configured to adjust a phase difference between the first travelling EM wave launched into the first location and the second travelling EM wave launched into the second location.

5. The processing system of claim 1, wherein the transmission waveguide comprises:
a first waveguide section and a second waveguide section that is oriented substantially orthogonal to the first waveguide section,
wherein the second waveguide section is oriented for the travelling EM wave to exit the second waveguide section in the direction substantially parallel to the surface of the substrate, and
wherein the first waveguide section is oriented for the travelling EM wave to bend substantially 90 degrees prior to entering into the second waveguide section from the first waveguide section.

6. The processing system of claim 1, wherein the transmission waveguide further comprises:
a coaxial transmission line that includes an outer conductor that is electrically coupled to the process chamber at an electrical ground and an inner conductor extending a distance into the process chamber.

7. The processing system of claim 6, wherein the inner conductor of the coaxial transmission line is positioned relative to a sidewall of the process chamber to prevent conversion of the travelling EM wave into a standing wave.

8. The processing system of claim 1, wherein the EM wave transmission antenna further comprises:
a line slot antenna configured to radiate the travelling EM wave through a plurality of slots in a wall of a waveguide section included in the line slot antenna.

9. The processing system of claim 8, wherein the process chamber comprises:
a plurality of dielectric windows located in a sidewall of the process chamber, wherein each of the plurality of dielectric windows corresponds to one of the plurality of slots of the line slot antenna and is configured to pass the travelling EM wave radiated from each corresponding one of the plurality of slots into the process chamber as the travelling EM wave propagates from the line slot antenna into the process chamber.

10. The processing system of claim 1, wherein the process chamber further comprises:
a planar bottom surface;
a planar top surface that opposes the planar bottom surface; and
a sidewall extending between the planar bottom surface and the planar top surface, wherein the sidewall includes a dielectric window.

11. The processing system of claim 10, wherein the process chamber further comprises:
an upper chamber section configured to house the substrate when the exposed surface of the substrate is directly exposed to the travelling EM wave;
a lower chamber section configured to house the substrate when the substrate is isolated from the travelling EM wave; and the substrate holder further configured to:
position the substrate disposed on the substrate holder in a position substantially coplanar with a planar bottom surface of the process chamber,
rotate the substrate, and
transport the substrate vertically between the upper chamber section and the lower chamber section.

12. The processing system of claim 11, wherein the substrate holder is further configured to transport the substrate vertically through an opening in the planar bottom surface of the upper chamber section to position the substrate substantially coplanar with the planar bottom surface of the upper chamber section.

13. A processing system for electromagnetic (EM) wave treatment of a substrate, comprising:
a process chamber configured to define a process space to house the substrate for exposure of a surface of the substrate to a surface EM wave, the process chamber having an input port and an output port;
a substrate holder enclosed by the process chamber and positioned in the process space, the substrate holder configured to hold a substrate and directly expose the substrate to the process space and that is configured to cool the substrate as the surface of the substrate is exposed to the surface EM wave;
an EM wave launcher system coupled to the input port and including an EM wave transmission antenna and a transmission waveguide and being configured to launch the surface EM wave from the transmission waveguide directly into the input port of the process chamber and directly into the process space for the surface EM wave to directly engage the substrate on the substrate holder and propagate in a direction substantially parallel to the surface of the substrate, wherein the transmission antenna includes an output end coupled to the transmission waveguide and the transmission waveguide is coupled directly to the input port of the process chamber;
a power coupling system configured to supply EM energy to the EM wave transmission antenna to generate the surface EM wave at a prescribed output power and in a prescribed EM wave mode during the cooling of the substrate, wherein the power coupling system is coupled to an input end of the transmission antenna; and
an EM wave absorbing load system coupled to the output port and including an EM wave receiving antenna, an EM wave absorbing load and a receiving waveguide, wherein the EM wave receiving antenna includes an input end that is coupled to the receiving waveguide and the receiving waveguide is coupled directly to the output port of the process chamber;
the EM wave absorbing load system being configured to:
substantially absorb all of the surface EM wave launched by the EM wave launcher system after propagation through the process chamber and propagation directly into the receiving waveguide so the EM wave is absorbed by the EM wave absorbing load for effectively removing the EM wave from the process chamber, and
minimize the reflections of the surface EM wave in the process chamber due to the absorbing of the surface EM wave by the EM wave absorbing load.

14. The processing system of claim 13, wherein the power coupling system is further configured to generate the surface EM wave at a microwave frequency in a range of 1 GHz to 100 GHz.

* * * * *